United States Patent
Cheng et al.

(10) Patent No.: US 10,522,396 B1
(45) Date of Patent: Dec. 31, 2019

(54) METHODS OF FABRICATING INTEGRATED CIRCUIT DEVICES HAVING REDUCED LINE END SPACES

(71) Applicant: Taiwan Semiconductor Manufacturing Co., Ltd., Hsinchu (TW)

(72) Inventors: Jye-Yen Cheng, Taichung (TW); Chen-Yu Shyu, Taipei (TW); Ming-Shuoh Liang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/174,998

(22) Filed: Oct. 30, 2018

(51) Int. Cl.
| | | |
|---|---|---|
| *H01L 21/4763* | (2006.01) | |
| *H01L 21/768* | (2006.01) | |
| *H01L 21/033* | (2006.01) | |
| *H01L 23/528* | (2006.01) | |
| *H01L 21/311* | (2006.01) | |
| *H01L 23/522* | (2006.01) | |

(52) U.S. Cl.
CPC .... *H01L 21/76816* (2013.01); *H01L 21/0334* (2013.01); *H01L 21/0337* (2013.01); *H01L 21/31144* (2013.01); *H01L 21/76807* (2013.01); *H01L 23/5283* (2013.01); *H01L 21/31111* (2013.01); *H01L 21/31116* (2013.01); *H01L 23/5226* (2013.01)

(58) Field of Classification Search
CPC ......... H01L 21/76816; H01L 21/31144; H01L 21/76807; H01L 21/0337; H01L 23/5283; H01L 21/0334; H01L 21/0335; H01L 21/0274; H01L 21/7681; H01L 21/76811; H01L 21/3083; H01L 21/308; H01L 21/32; H01L 21/76802; H01L 23/5226
See application file for complete search history.

(56) References Cited

U.S. PATENT DOCUMENTS

2010/0187600 A1\* 7/2010 Masuoka .......... H01L 29/42392
257/329
2016/0351669 A1\* 12/2016 Shiao .................. H01L 29/4175

\* cited by examiner

*Primary Examiner* — Hsien Ming Lee
(74) *Attorney, Agent, or Firm* — Birch, Stewart, Kolasch & Birch, LLP

(57) ABSTRACT

Methods of fabricating an integrated circuit device are provided. The method includes depositing a dielectric layer and a first hard mask layer in sequence over a substrate. The method also includes forming a patterned second hard mask on the first hard mask layer, and forming a third hard mask portion in an opening of the patterned second hard mask. The method further includes removing the patterned second hard mask to leave the third hard mask portion on the first hard mask layer, and etching the first hard mask layer to form a patterned first hard mask. In addition, the method includes etching the dielectric layer by using the patterned first hard mask as an etching mask to form trenches in the dielectric layer, and filling the trenches with a conductive material to form conductive lines.

20 Claims, 29 Drawing Sheets

METHODS OF FABRICATING INTEGRATED CIRCUIT DEVICES HAVING REDUCED LINE END SPACES

BACKGROUND

Semiconductor devices are typically fabricated by depositing insulating or dielectric layers, conductive layers, and semiconductor layers over a semiconductor substrate, and patterning the various material layers using lithography to form circuit components and elements thereon. The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of processing and manufacturing ICs. When a semiconductor device is scaled down through various technology nodes, interconnects of metal lines that facilitate wiring between the transistors and other devices play an important role in IC performance. Although existing methods of fabricating IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
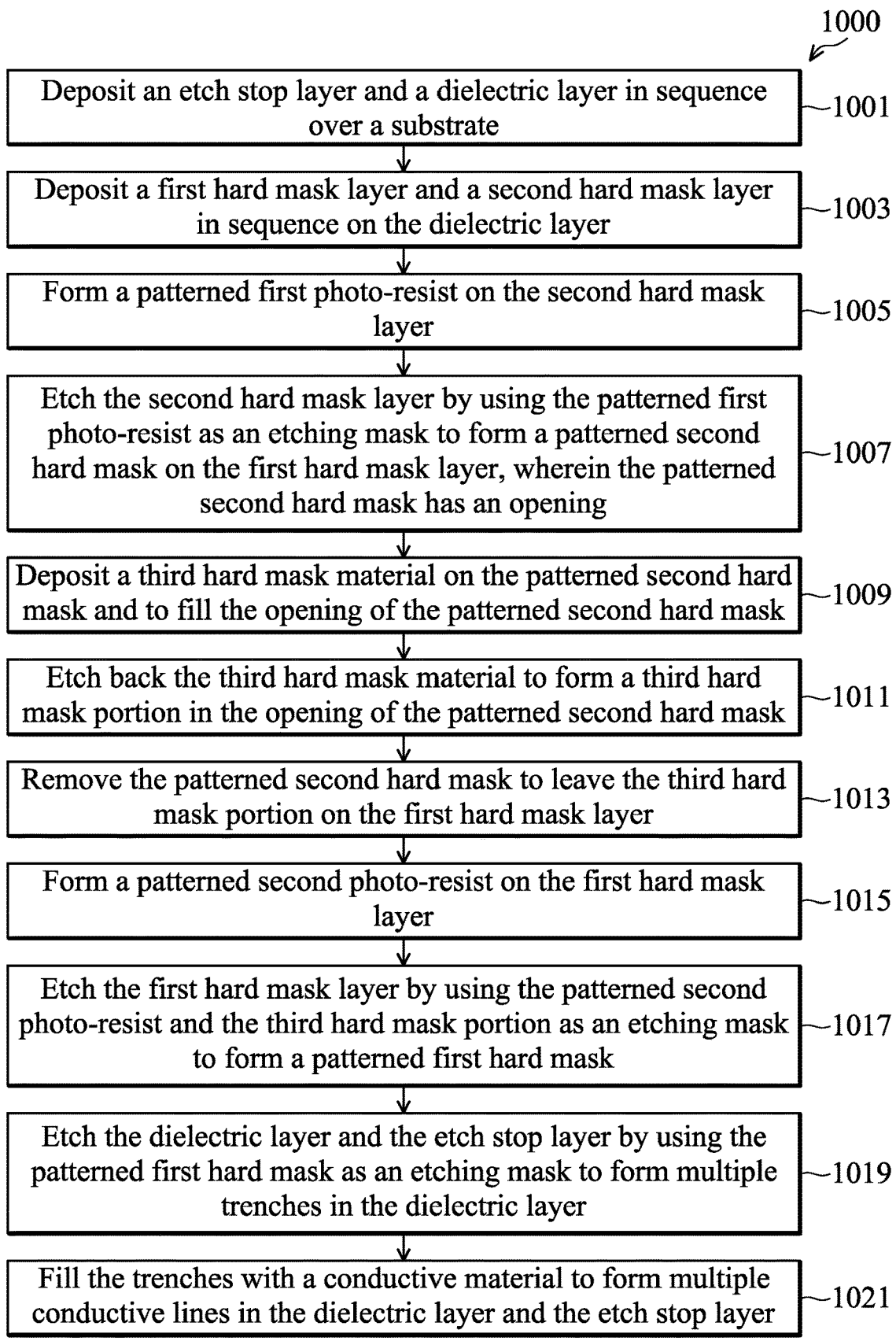
FIG. 1 is a flow chart of an exemplary method of fabricating an integrated circuit device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to fabricating integrated circuit devices having reduced line end spaces. The reduced line end space is formed by a line cut process that cuts one conductive line into at least two sub-conductive lines. The line cut process is performed by using multiple lithography, etching and deposition processes to form the sub-conductive lines with concave line-ends. The reduced line end space is produced between the concave line-ends of the sub-conductive lines. The integrated circuit devices having the reduced line end space can increase conductive lines' routing density for die size reduction.

As the integrated circuit (IC) industry has progressed into multiple technology nodes of 20 nm (N20), 16 nm (N16), 10 nm (N10), 7 nm (N7) and beyond, there is less and less space between conductive lines in an interconnect structure. Layout designs for integrated circuit devices have become interconnect-limited. It is important to increase conductive lines' routing density for IC technology nodes of N7 and beyond.

Generally, conductive lines formed by lithography and optical proximity correction (OPC) technology have convex line-ends. Design rule for the conductive lines having the convex line-ends needs to define a line end space that is large enough to cover etching process bias and patterning process variation, due to the concern about a line-end bridge. The conductive lines' routing density is thereby limited.

According to the embodiments of disclosure, the conductive lines are formed by a line cut process to have concave line-ends. The line end space between the conductive lines formed by the line cut process is reduced while compared with the conductive lines having the convex line-ends formed by lithography and OPC technology. Therefore, the embodiments of the disclosure are suitable for integrated circuit devices at technology nodes of N20, N16, N10, N7 and beyond.

The foregoing broadly outlines some aspects of the embodiments described herein. Some embodiments described herein are described in the context of conductive lines formed in a back-end-of-line (BEOL) process in an interconnect structure for an integrated circuit device. The integrated circuit device includes various active components and passive components. The active components may be photodiodes, planar FETs, FinFETs, or other transistors. The passive components are, for example, resistors, capacitors, and inductors. The active components and the passive components of the integrated circuit device are electrically coupled through an interconnect structure. The interconnect structure includes multiple metal layers having the conductive lines with the convex line-ends. The line end space between the convex line-ends of the conductive lines formed by the embodiments of disclosure is reduced. Therefore, the conductive lines' routing density is increased for die size reduction.

Some variations of the exemplary methods and structures are described in the embodiments of disclosure. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

FIG. 1 is a flow chart of an exemplary method 1000 of fabricating an integrated circuit device, in accordance with some embodiments. FIGS. 2A, 3A, 4A, 5A, 6A, 7A, 8A, 9A, 10A, 11A and 12A are top views of intermediate structures at various stages of an exemplary method for fabricating an integrated circuit device 100, in accordance with some embodiments. In addition, FIGS. 2B, 3B, 4B, 5B, 6B, 7B, 8B, 9B, 10B, 11B and 12B are cross-sectional views of intermediate structures at various stages of the exemplary method for fabricating the integrated circuit device 100, in accordance with some embodiments, along line B-B in FIGS. 2A, 3A, 4A, 5A, 6A, 7A, 8A, 9A, 10A, 11A and 12A, respectively.

The integrated circuit device 100 includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, another suitable component, or a combination thereof. The transistors may be planar transistors or multi-gate transistors, such as FinFETs.

Figure 2A:
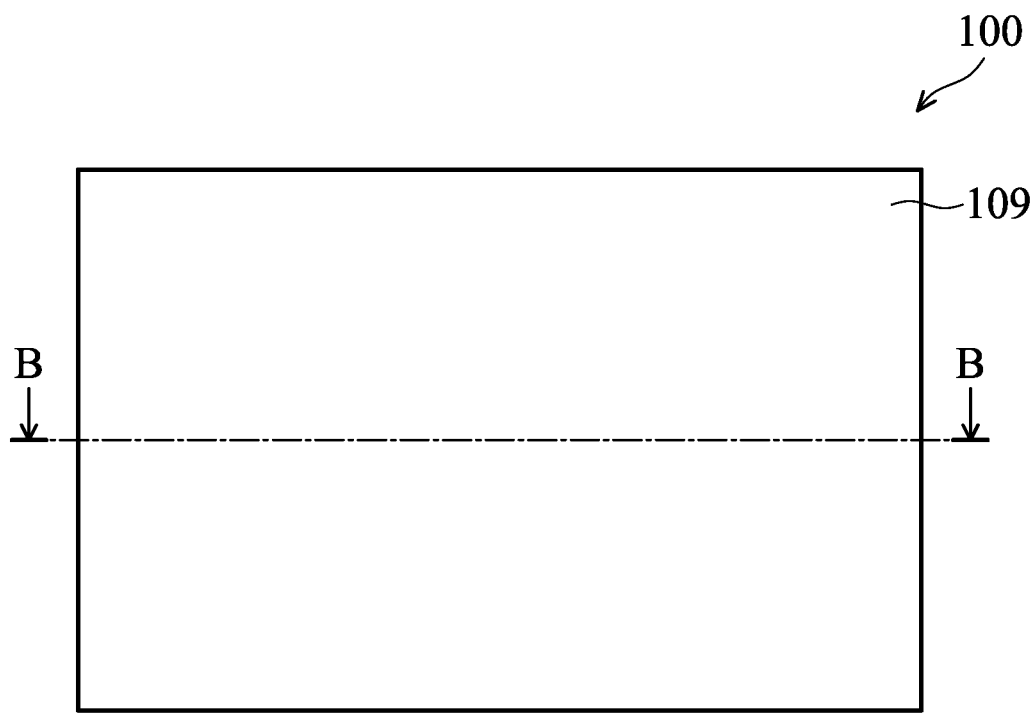
FIGS. 2A, 3A, 4A, 5A, 6A, 7A, 8A, 9A, 10A, 11A and 12A are top views of intermediate structures at various stages of an exemplary method of fabricating an integrated circuit device, in accordance with some embodiments.
Figure 2B:
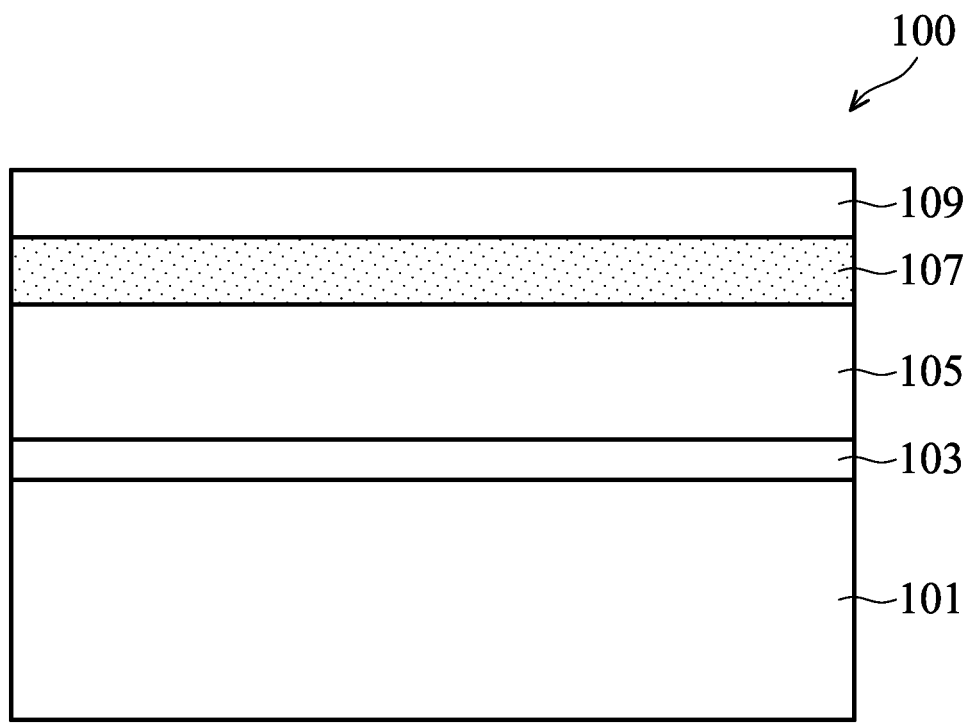
FIGS. 2B, 3B, 4B, 5B, 6B, 7B, 8B, 9B, 10B, 11B and 12B are cross-sectional views of intermediate structures at various stages of an exemplary method for fabricating an integrated circuit device, in accordance with some embodiments, along line B-B in FIGS. 2A, 3A, 4A, 5A, 6A, 7A, 8A, 9A, 10A, 11A and 12A, respectively.

In block 1001 of the method 1000, an etch stop layer and a dielectric layer are deposited in sequence over a substrate. Firstly, a substrate 101 is provided, as shown in FIG. 2B in accordance with some embodiments. The substrate 101 may be a bulk semiconductor substrate, a semiconductor-on-insulator (SOI) substrate, or another semiconductor substrate, which may be doped (e.g., with a p-type or an n-type dopant) or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 101 may be made of silicon or another semiconductor material. For example, the substrate 101 is a silicon wafer. In some examples, the substrate 101 is made of a compound semiconductor such as silicon carbide, gallium arsenic, indium arsenide, or indium phosphide. In some examples, the substrate 101 is made of an alloy semiconductor such as GaAsP, AlInAs, AlGaAs, GaInAs, GaInP, or GaInAsP.

The substrate 101 may include various p-type doped regions and/or n-type doped regions formed therein. Those doped regions include n-well, p-well, source and drain (S/D) regions. The substrate 101 may further include gate structures and/or electrodes formed thereon. The doped regions, the gate structures and/or the electrodes are configured to form various integrated circuit (IC) devices, such as a complementary metal-oxide-semiconductor field-effect transistor (CMOSFET), imaging sensor, and/or light emitting diode (LED). The substrate 101 may further include other functional features such as a resistor or a capacitor formed in and on the substrate.

The substrate 101 may also include isolation structures. The isolation structures separate various device regions in the substrate 101. The isolation structures include shallow trench isolation (STI) structures. The formation of a STI structure may include etching a trench in the substrate 101 and filling in the trench with insulator materials such as silicon oxide, silicon nitride, or silicon oxynitride.

Still in block 1001 of the method 1000 and with reference to FIG. 2B, an etch stop layer 103 is deposited on the substrate 101 and a dielectric layer 105 is deposited on the etch stop layer 103, in accordance with some embodiments. Generally, the etch stop layer 103 can provide a mechanism to stop an etching process when forming contact holes or via holes for electrical connections to the device regions in the substrate 101 and/or the electrodes on the substrate 101. The etch stop layer 103 may be formed of a dielectric material that has an etch selectivity different from adjacent layers, for example, the dielectric layer 105. The etch stop layer 103 may be made of silicon nitride, silicon carbide, silicon carbon nitride, or a combination thereof, and may be deposited by chemical vapor deposition (CVD), plasma enhanced CVD (PECVD), atomic layer deposition (ALD), or another deposition technique.

In some embodiments, the dielectric layer 105 is an inter-metal dielectric (IMD) layer. The material of the dielectric layer 105 is for example, silicon oxide, silicon nitride, tetraethoxysilane (TEOS) formed oxide, a low-k dielectric material, another suitable dielectric material, or a combination thereof. The low-k dielectric material is a material having a dielectric constant (k-value) lower than k-value (about 3.9) of silicon dioxide. The low-k dielectric material is for example phosphosilicate glass (PSG), borosilicate glass (BSG), borophosphosilicate glass (BPSG), undoped silicate glass (USG), fluorinated silicate glass (FSG), organosilicate glass (OSG), SiOxCy, spin-on-glass (SOG), spin-on-polymers, carbon doped silicon oxide, Black Diamond® (Applied Materials of Santa Clara, Calif.), Xerogel, Aerogel, amorphous fluorinated carbon, parylene, benzocyclobutene (BCB), SiLK (Dow Chemical, Midland, Mich.), polyimide, or a combination thereof. The dielectric layer 105 may be deposited by spin-on coating, CVD, PECVD, physical vapor deposition (PVD), or another deposition technique.

In block 1003 of the method 1000, a first hard mask layer and a second hard mask layer are deposited in sequence on the dielectric layer. Referring to FIG. 2B, a first hard mask layer 107 is deposited on the dielectric layer 105, and a second hard mask layer 109 is deposited on the first hard mask layer 107, in accordance with some embodiments. FIG. 2A shows a top view of the second hard mask layer 109 at a stage of an exemplary method for fabricating the integrated circuit device 100, in accordance with some embodiments. FIG. 2B shows a cross-sectional view of an intermediate structure along line B-B in FIG. 2A for fabricating the integrated circuit device 100, in accordance with some embodiments.

In some embodiments, the first hard mask layer 107 and the second hard mask layer 109 are made of different materials to achieve etching selectivity during subsequent etch processes. The first hard mask layer 107 and the second hard mask layer 109 may independently include silicon oxide, silicon nitride, silicon oxynitride, silicon carbide, titanium oxide, titanium nitride, tantalum oxide, tantalum nitride, and/or any other suitable material. The first hard mask layer 107 and the second hard mask layer 109 may be independently deposited by spin-on coating, CVD, PECVD, PVD, or another deposition technique.

Figure 3A:
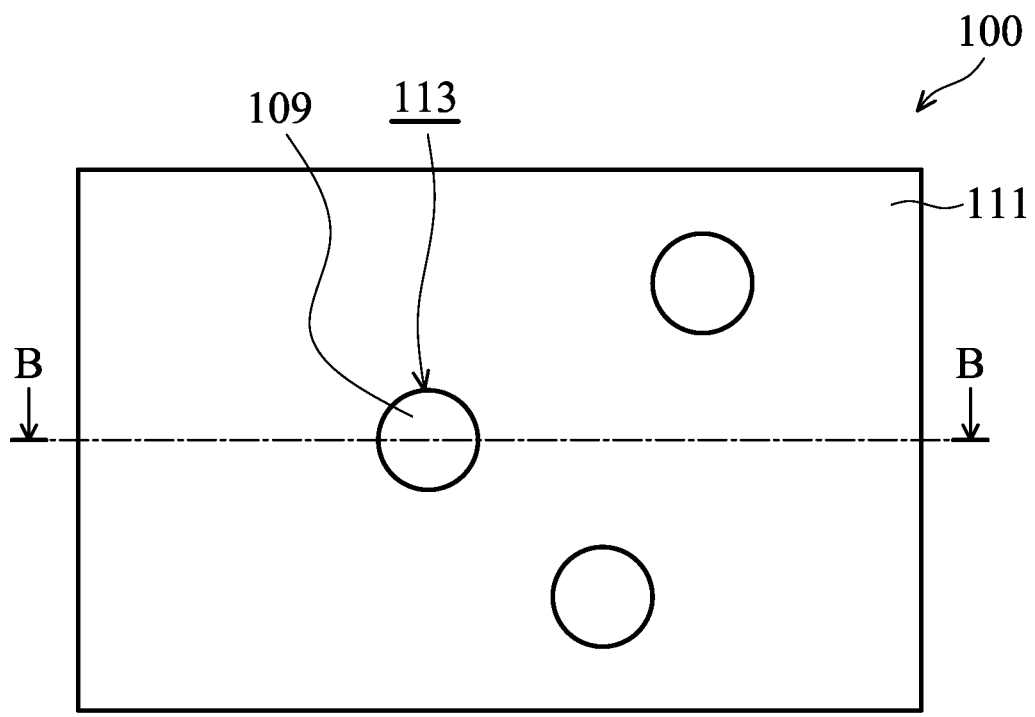
Figure 3B:
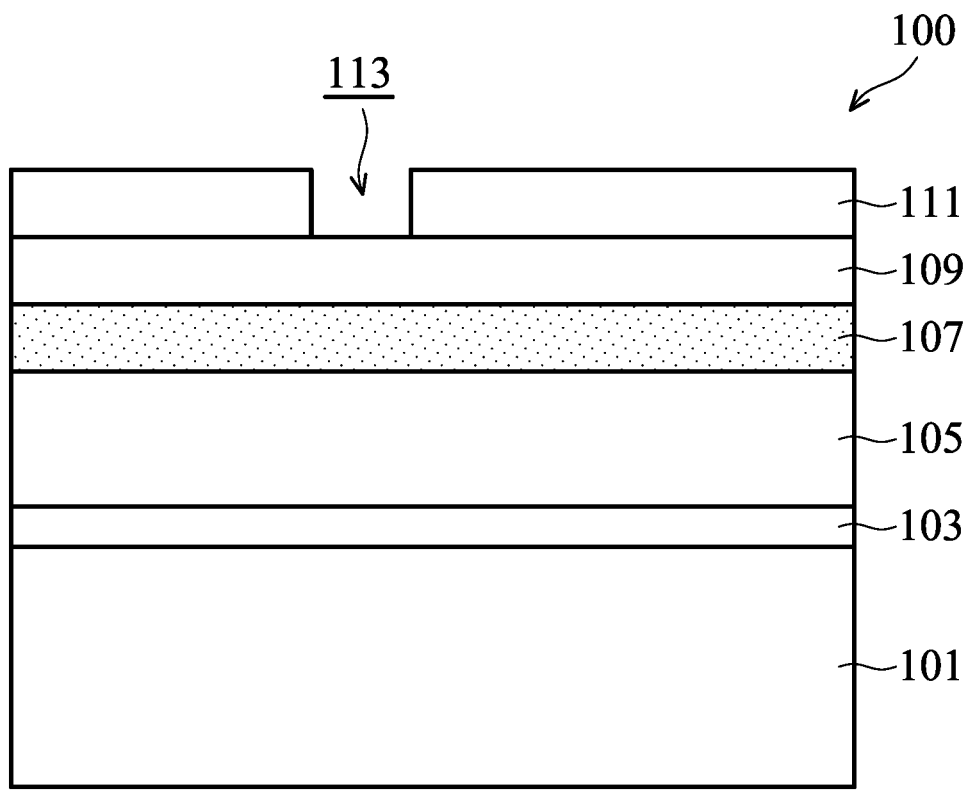

In block 1005 of the method 1000, a patterned first photo-resist is formed on the second hard mask layer. Referring to FIGS. 3A and 3B, a patterned photo-resist 111 is formed on the second hard mask layer 109, in accordance with some embodiments. The patterned photo-resist 111 has several openings 113 to expose portions of the second hard mask layer 109. In some embodiments, the opening 113 has the shape of a circle. The pattern of the opening 113 may use the pattern of a via in an interconnect structure. The patterned photo-resist 111 may be formed by lithography process. An exemplary lithography process may include coating a photoresist layer, exposing the photoresist layer by a lithography exposure process, performing a post-exposure bake process, and developing the exposed photoresist layer to form the patterned photo-resist.

Figure 4A:
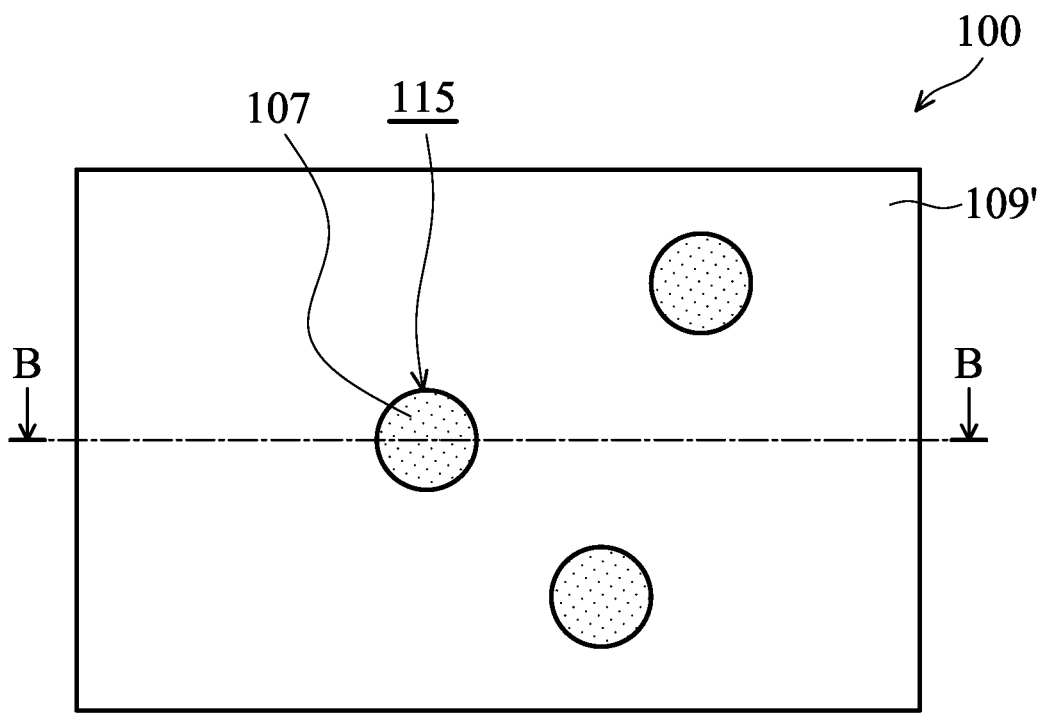
Figure 4B:
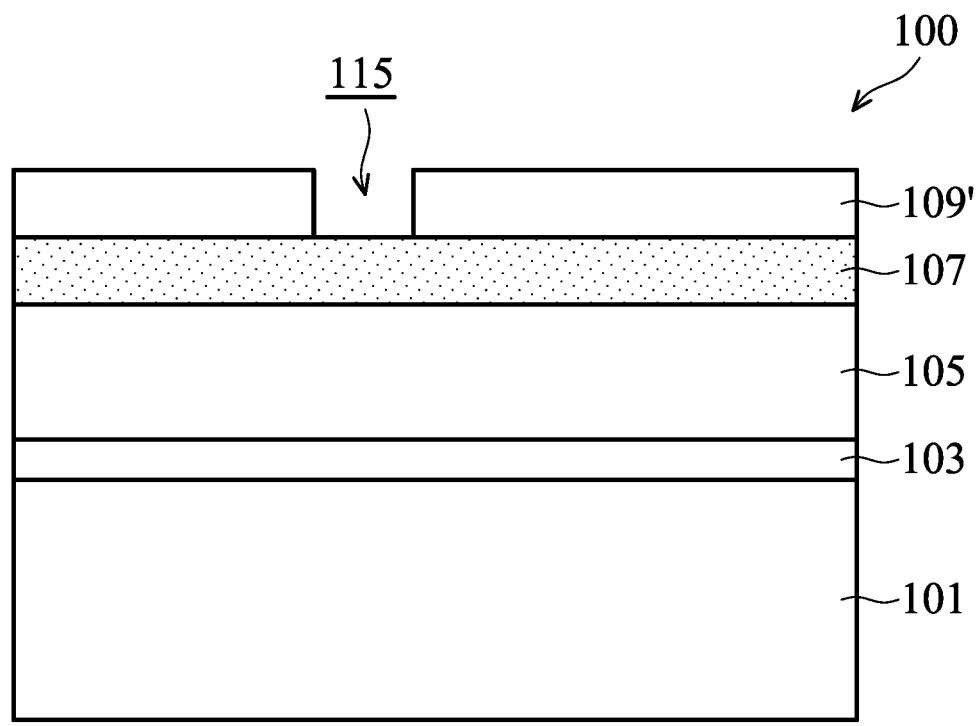

In block 1007 of the method 1000, the second hard mask layer is etched by using the patterned first photo-resist as an etching mask to form a patterned second hard mask on the first hard mask layer, wherein the patterned second hard mask has an opening. Referring to FIGS. 4A and 4B, the second hard mask layer 109 is patterned to form a patterned second hard mask 109' having several openings 115 on the first hard mask layer 107, in accordance with some embodiments. The second hard mask layer 109 is patterned in an etching process by using the patterned photo-resist 111 as an etching mask.

The etching process is anisotropic and may include a wet etch process, a dry etch process or a combination thereof. In some examples, the dry etch process may be performed with fluorine-based plasma and uses etch gases, such as $C_4F_8$, $C_2F_6$, $CF_4$, $CHF_3$, $CH_2F_2$, $CH_3F$ or a combination thereof. In some examples, the wet etch process may use a fluoride-based aqueous etch solution, for example diluted hydrofluoric acid (dHF). The shape of the opening 115 may be the same as that of the opening 113 of the patterned photo-resist 111. Some portions of the first hard mask layer 107 are exposed through the openings 115. After the patterned second hard mask 109' is formed, the patterned photo-resist 111 is removed by a wet stripping or a plasma ashing process.

Figure 5A:
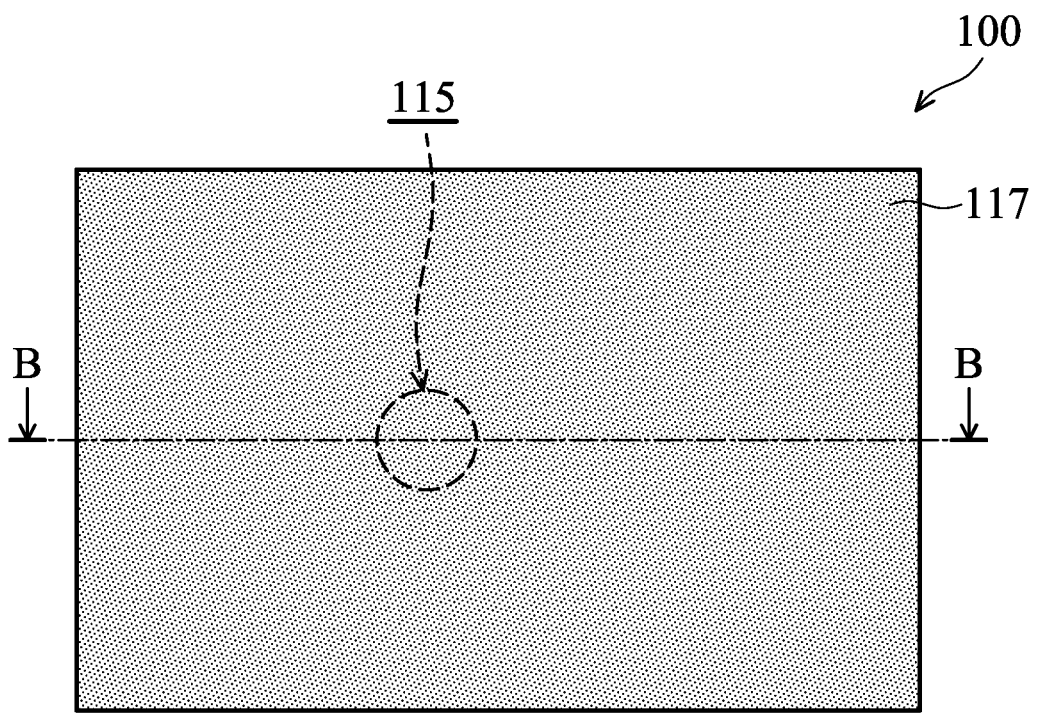
Figure 5B:
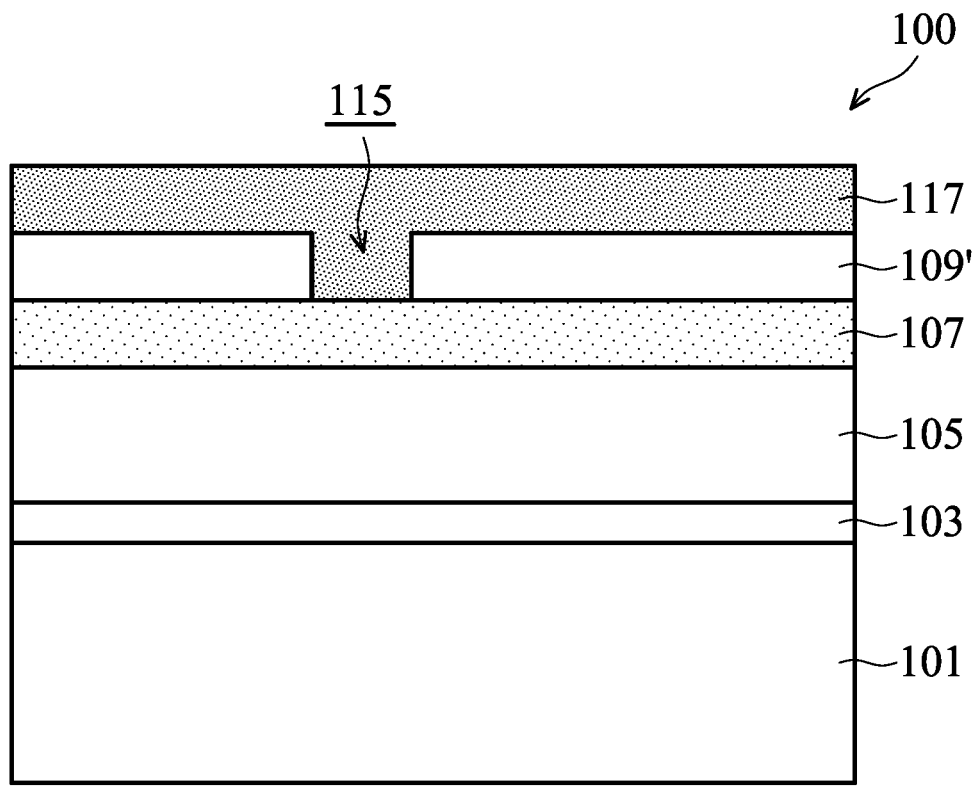

In block 1009 of the method 1000, a third hard mask material is deposited on the patterned second hard mask and to fill the opening of the patterned second hard mask. Referring to FIGS. 5A and 5B, a third hard mask material 117 is deposited on the patterned second hard mask 109', and to fill the opening 115 of the patterned second hard mask 109', in accordance with some embodiments. In some embodiments, the third hard mask material 117 is the same as or similar to the material of the first hard mask layer 107. In some other embodiments, the third hard mask material 117 is different from the materials of the first hard mask layer 107 and the second hard mask layer 109. The third hard mask material 117 may include silicon oxide, silicon nitride, silicon oxynitride, silicon carbide, titanium oxide, titanium nitride, tantalum oxide, tantalum nitride, and/or any other suitable material, and may be deposited by spin-on coating, CVD, PECVD, PVD, or another deposition technique.

Figure 6A:
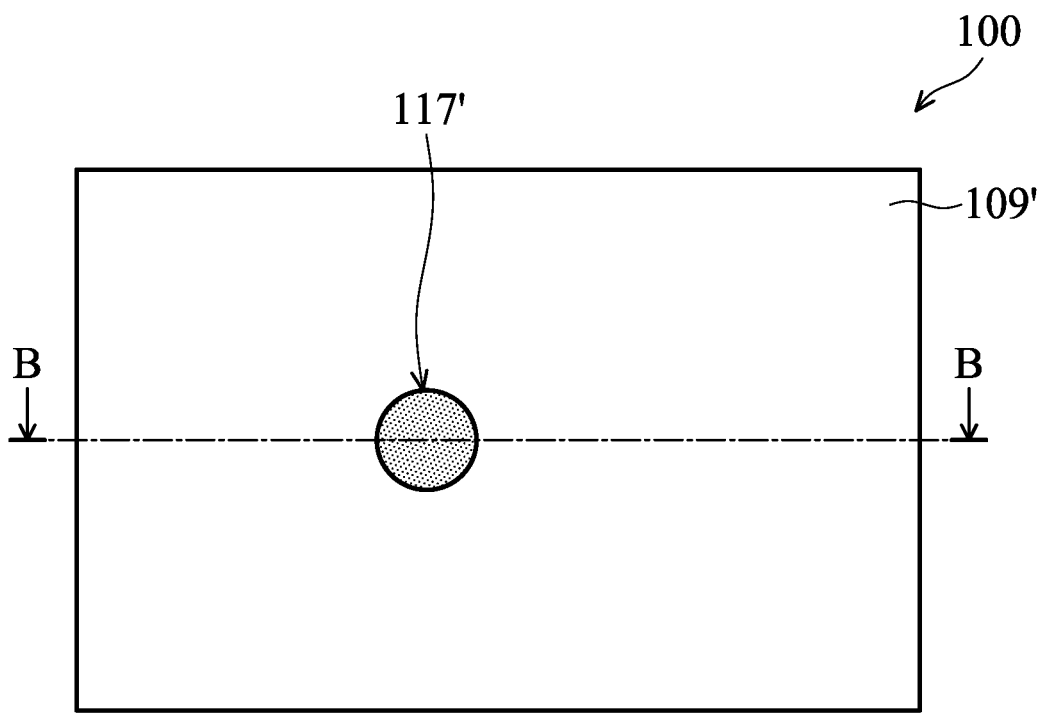
Figure 6B:
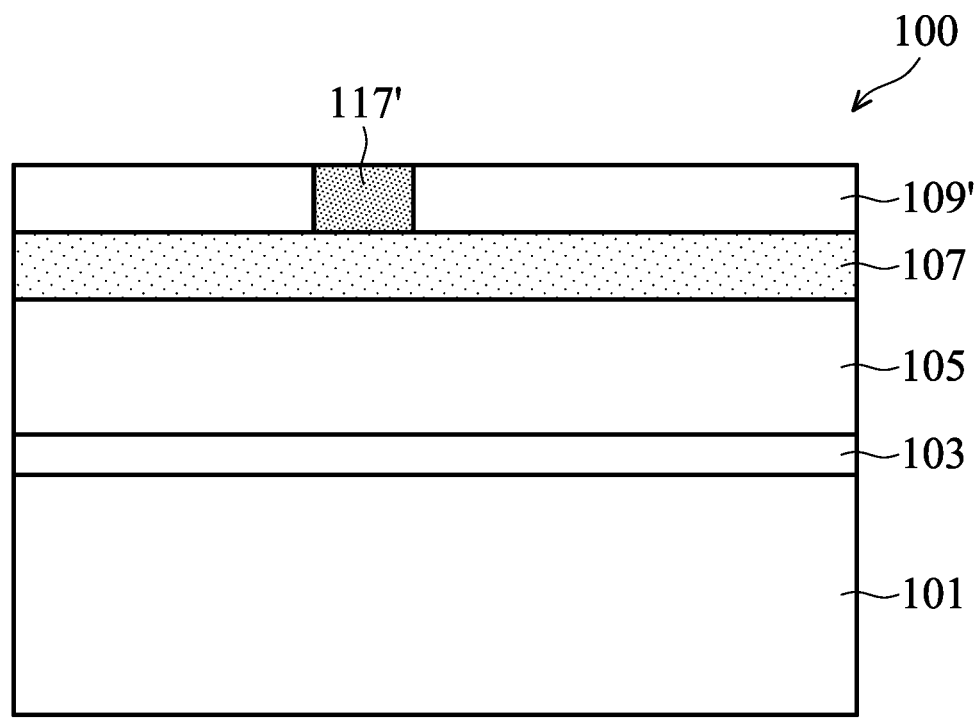

In block 1011 of the method 1000, the third hard mask material is etched back to form a third hard mask portion in the opening of the patterned second hard mask. Referring to FIGS. 6A and 6B, the third hard mask material 117 is etched back to form a third hard mask portion 117' in the opening 115 of the patterned second hard mask 109', in accordance with some embodiments. The third hard mask material 117 may be etched back by using a planarization process, for example a chemical mechanical polishing (CMP) process. The portions of the third hard mask material 117 on the patterned second hard mask 109' are removed by the CMP process. Thereafter, the top surface of the third hard mask portion 117' may be coplanar with the top surface of the patterned second hard mask 109'.

Figure 7A:
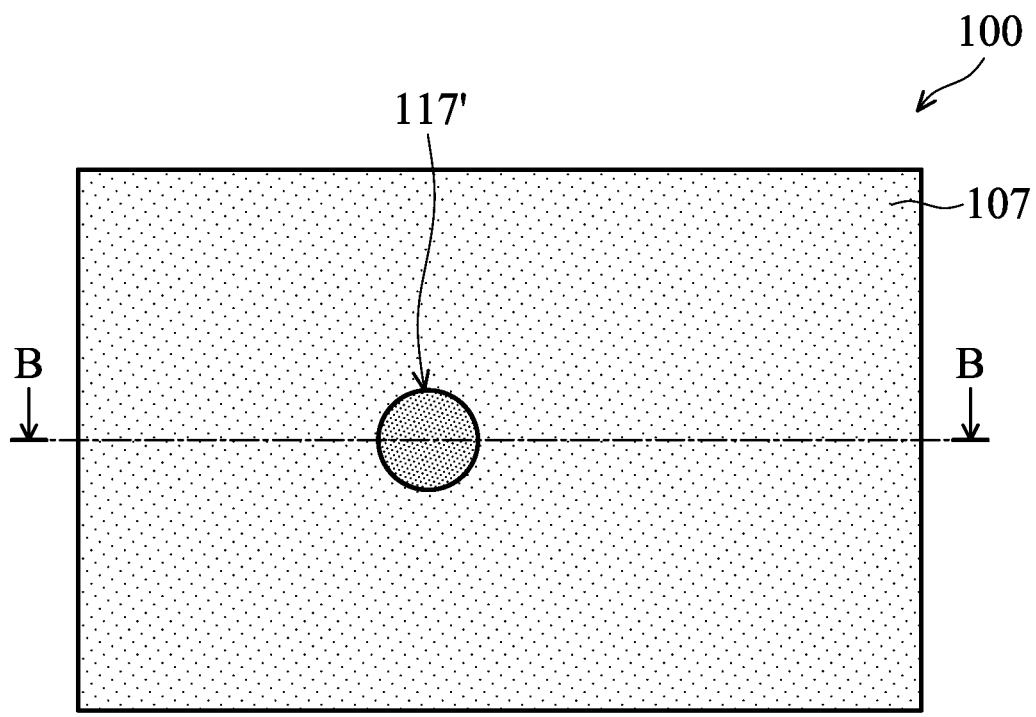
Figure 7B:
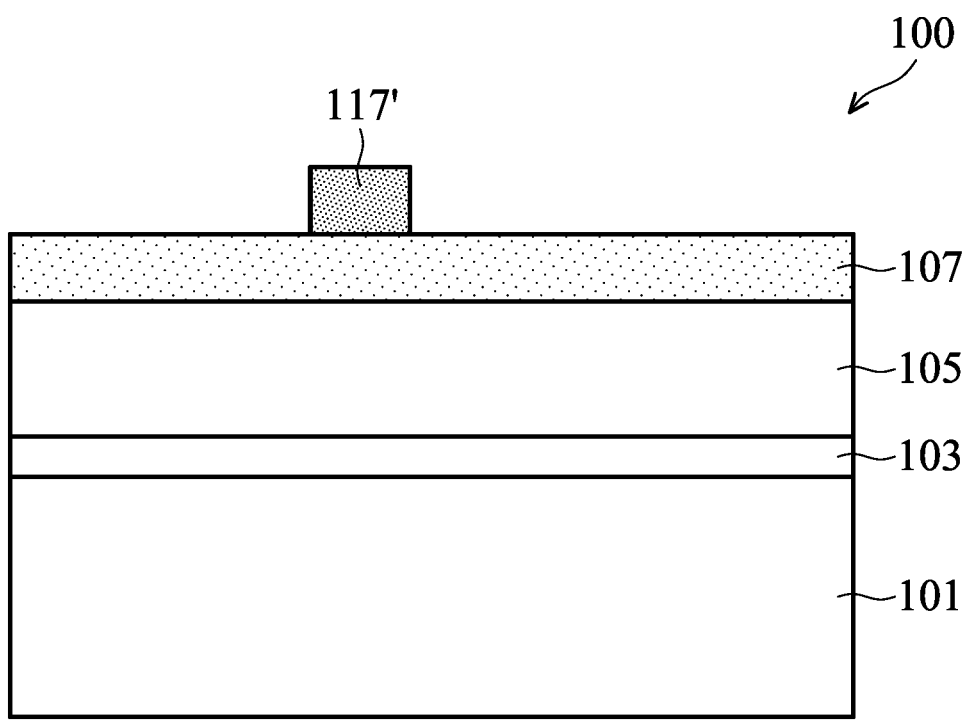

In block 1013 of the method 1000, the patterned second hard mask is removed, and the third hard mask portion remains on the first hard mask layer. Referring to FIGS. 7A and 7B, the patterned second hard mask 109' is removed to leave the third hard mask portion 117' on the first hard mask layer 107, in accordance with some embodiments. The patterned second hard mask 109 is removed by an etching process. The patterned second hard mask 109 has an etch selectivity that is higher than the etch selectivity of the first hard mask layer 107 and the etch selectivity of the third hard mask portion 117'. The etching process may include a wet etch, a dry etch or a combination thereof. In some examples, the dry etch process may be performed with fluorine-based plasma and uses etch gases, such as $C_4F_8$, $C_4F_6$, $CF_4$, $CHF_3$, $CH_2F_2$, $CH_3F$ or a combination thereof. In some examples, the wet etch process may use a fluoride-based aqueous etch solution, for example diluted hydrofluoric acid (dHF), or a mixture of HCl, $FeCl_3$ and/or $H_2O$.

Figure 8A:
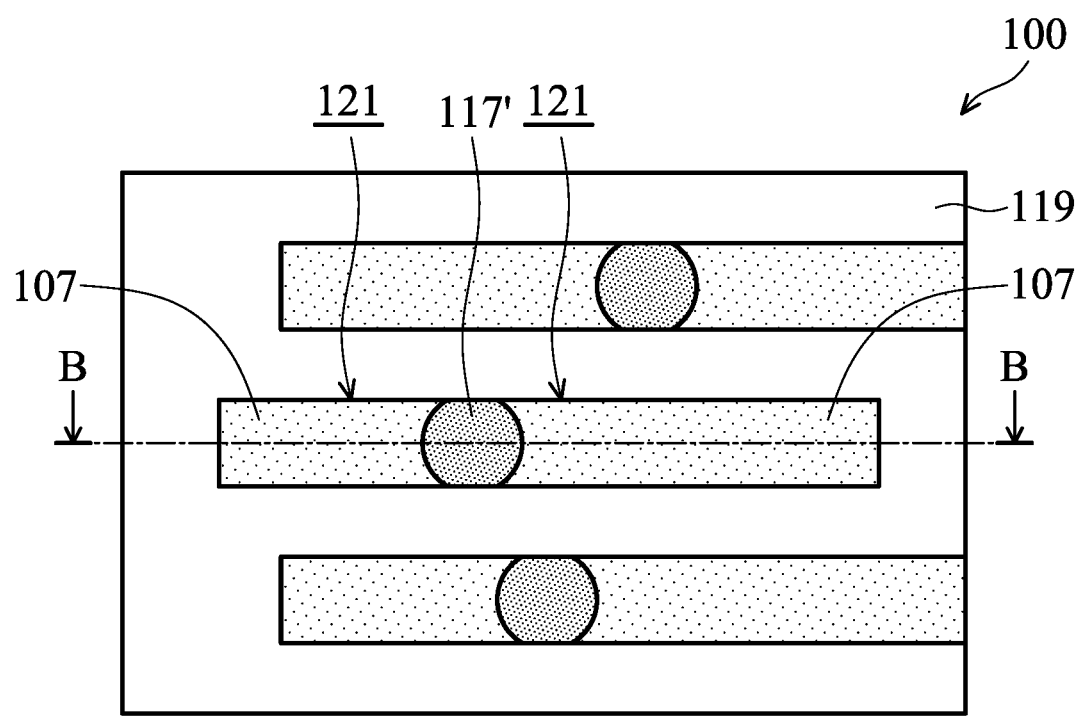
Figure 8B:
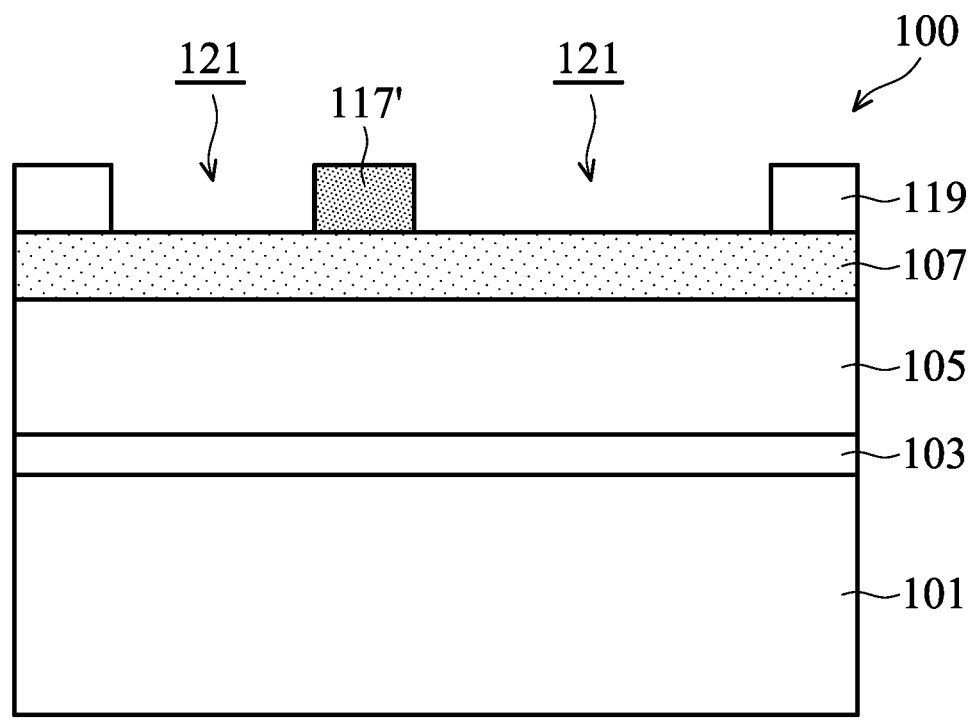

In block 1015 of the method 1000, a patterned second photo-resist is formed on the first hard mask layer. Referring to FIGS. 8A and 8B, a patterned photo-resist 119 is formed on the first hard mask layer 107, in accordance with some embodiments. The patterned photo-resist 119 has several line-shaped openings 121. Moreover, the third hard mask portion 117' is located in the line-shaped opening 121. Some portions of the third hard mask portion 117' are covered with the patterned photo-resist 119, as shown in FIG. 8A in accordance with some embodiments. For example, two ends of the third hard mask portion 117' outside the line-shaped opening 121 are covered with the patterned photo-resist 119. In addition, some portions of the first hard mask layer 107 are exposed through the line-shaped opening 121.

Figure 9A:
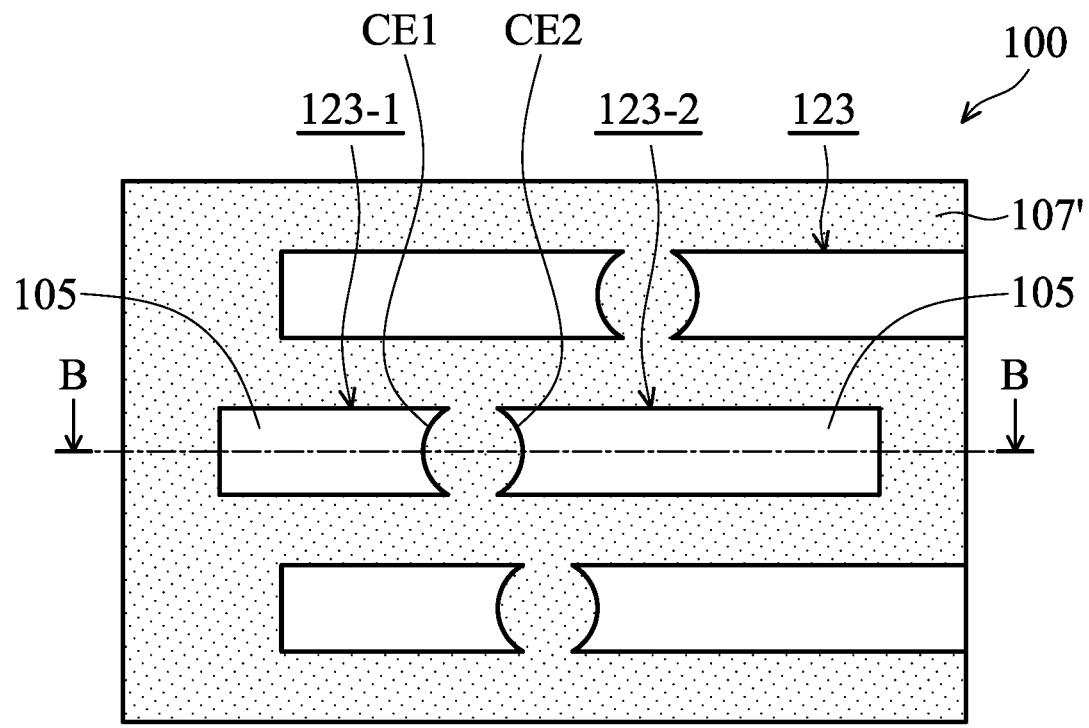
Figure 9B:
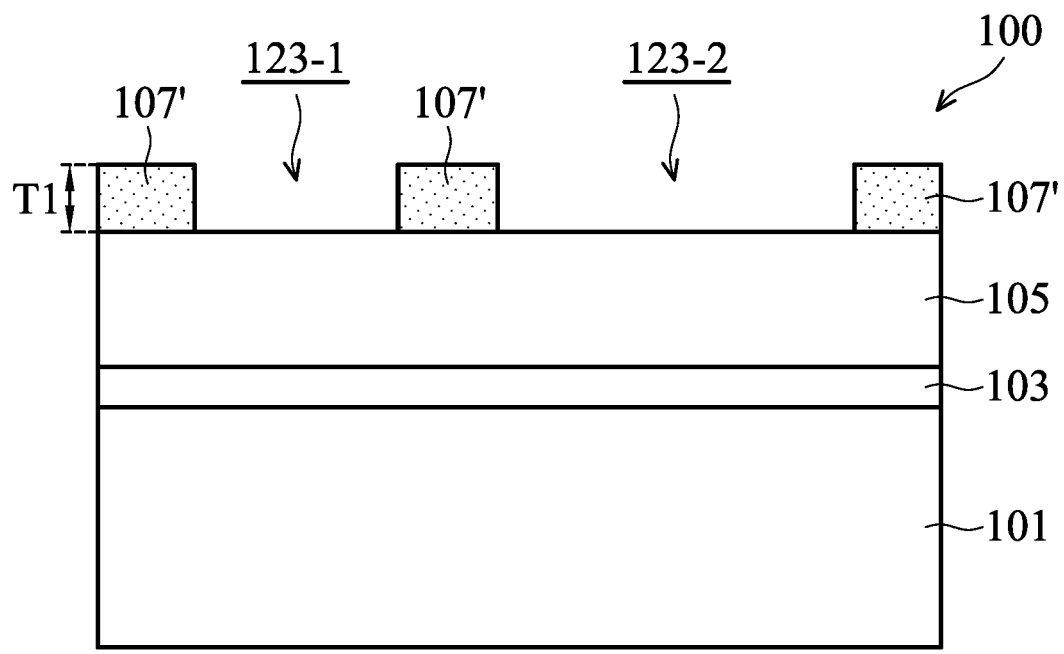

In block 1017 of the method 1000, the first hard mask layer is etched by using the patterned second photo-resist and the third hard mask portion as an etching mask to form a patterned first hard mask. Referring to FIGS. 9A and 9B, the first hard mask layer 107 is patterned by using the third hard mask portion 117' and the patterned photo-resist 119 as an etching mask to form a patterned first hard mask 107', in accordance with some embodiments. The patterned first hard mask 107' has multiple line-shaped openings 123 to expose portions of the dielectric layer 105. Two adjacent line-shaped openings 123 are aligned in their longitudinal axes. The left line-shaped opening 123-1 has a concave end CE1 facing another concave end CE2 of the right line-shaped opening 123-2, as shown in FIG. 9A in accordance with some embodiments.

The concave ends CE1 and CE2 of the line-shaped openings 123-1 and 123-2 are formed by the shape of the third hard mask portion 117' and the line-shaped opening 121 of the patterned photo-resist 119 (as shown in FIG. 8A). In some embodiments, the first hard mask layer 107 is patterned by an etching process. The etching process is anisotropic and may include a wet etch, a dry etch or a combination thereof. After the patterned first hard mask 107' is formed, the patterned photo-resist 119 is removed by a wet stripping or a plasma ashing process. In addition, the third hard mask portion 117' is also removed during the etching process for forming the patterned first hard mask 107'.

Figure 10A:
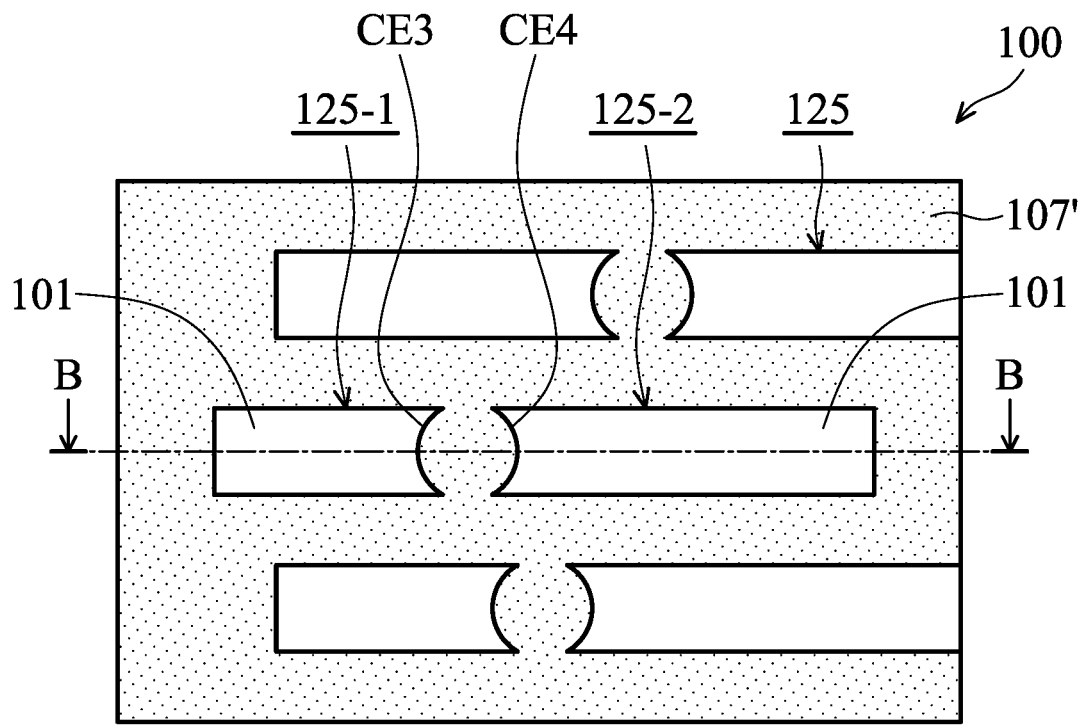
Figure 10B:
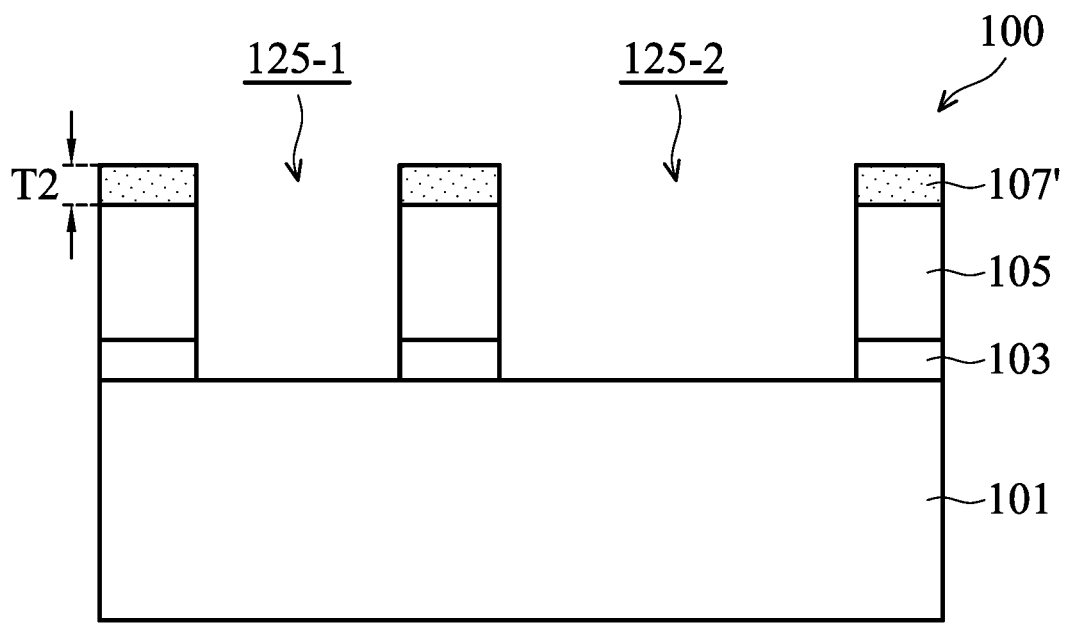

In block 1019 of the method 1000, the dielectric layer and the etch stop layer are etched by using the patterned first hard mask as an etching mask to form multiple trenches in the dielectric layer. Referring to FIGS. 10A and 10B, the dielectric layer 105 and the etch stop layer 103 are etched by using the patterned first hard mask 107' as an etching mask to form multiple trenches 125 in the dielectric layer 105 and the etch stop layer 103, in accordance with some embodiments.

The dielectric layer 105 and the etch stop layer 103 may be etched by one or more etching processes. The etching process may include a wet etch, a dry etch or a combination thereof. In some examples, the dry etching process may be performed with fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some examples, after the etching process, the patterned first hard mask 107' remains on the dielectric layer 105. The remaining patterned first hard mask 107' has a thickness T2 that is less than the thickness T1 (FIG. 9B) of the patterned first hard mask 107' before the etching process. In some other examples, after the etching process, the patterned first hard mask 107' is removed and does not remain on the dielectric layer 105.

In the embodiments, the pattern of the line-shaped openings 123 of the patterned first hard mask 107' is transferred to the dielectric layer 105 and the etch stop layer 103 by the etching process to form the trenches 125. Therefore, the shape of the trenches 125 may be the same as or similar to that of the line-shaped openings 123. Also, the left trench 125-1 has a concave end CE3 facing another concave end CE4 of the right trench 125-2, as shown in FIG. 10A in accordance with some embodiments. In some embodiments, the trenches 125 are formed to pass through the dielectric layer 105 and the etch stop layer 103. The substrate 101 is thereby exposed through the trenches 125. In some other embodiments, the trenches 125 are formed in the dielectric layer 105 and do not passing through the dielectric layer 105 and the etch stop layer 103.

Figure 11A:
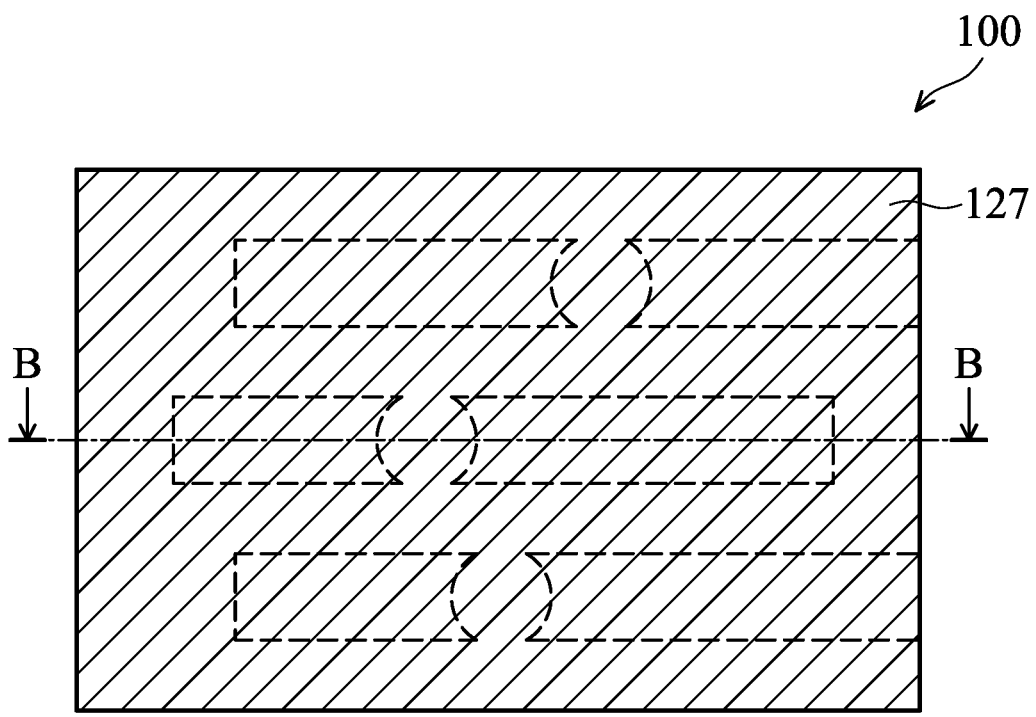
Figure 11B:
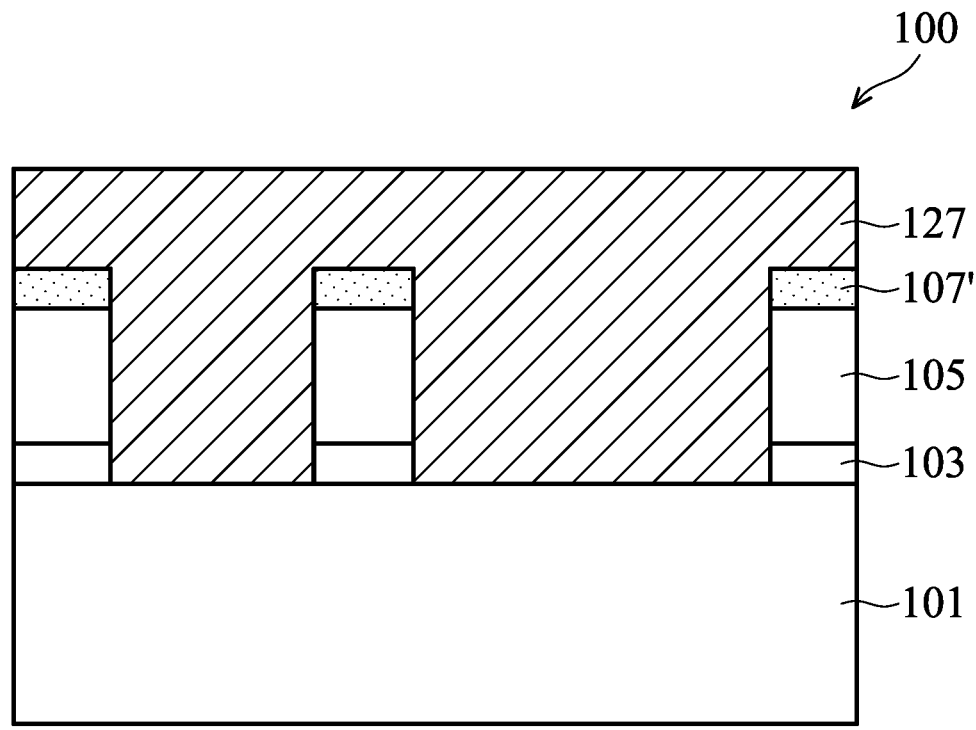

In block 1021 of the method 1000, the trenches are filled with a conductive material to form multiple conductive lines in the dielectric layer and the etch stop layer. Referring to FIGS. 11A and 11B, a conductive material 127 is deposited on the remaining patterned first hard mask 107' and to fill the trenches 125 in the dielectric layer 105 and the etch stop layer 103, in accordance with some embodiments. In some examples, the conductive material 127 includes copper (Cu), cobalt (Co), tungsten (W), ruthenium (Ru), silver (Ag), gold (Au), cobalt tungsten (CoW), cobalt silicon (CoSi), tantalum (Ta), titanium (Ti), tantalum nitride (TaN), titanium nitride (TiN), another suitable metal, alloy thereof, or a combination thereof. The conductive material 127 may be a single-layered or multiple-layered structure. The conductive material 127 may be deposited by PVD, CVD, metal-organic chemical vapor deposition (MOCVD), ALD, electroplating, electro-less plating, another suitable deposition process, or a combination thereof.

In some embodiments, before depositing the conductive material 127, a liner (not shown) is formed in the trenches 125. The liner is conformally deposited on the sidewalls and on the bottoms of the trenches 125. The liner may be used as a diffusion barrier layer, an adhesion layer, or a combination thereof. The liner may include titanium, titanium nitride, tantalum, tantalum nitride, or a combination thereof, and may be deposited by ALD, PECVD, PVD, or another deposition technique.

Figure 12A:
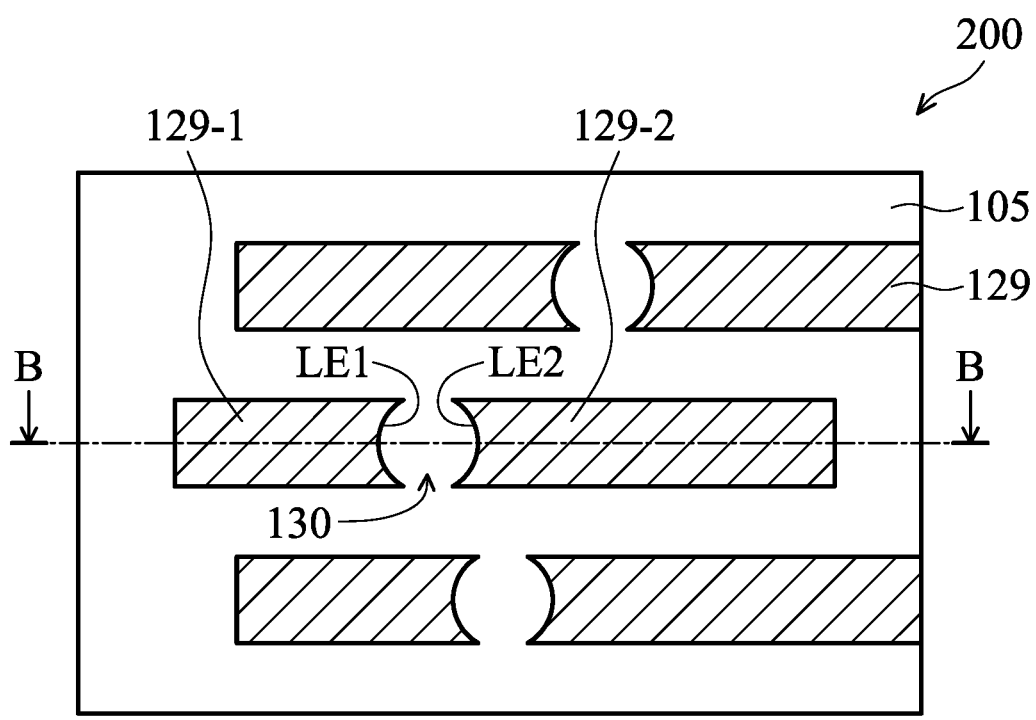
Figure 12B:
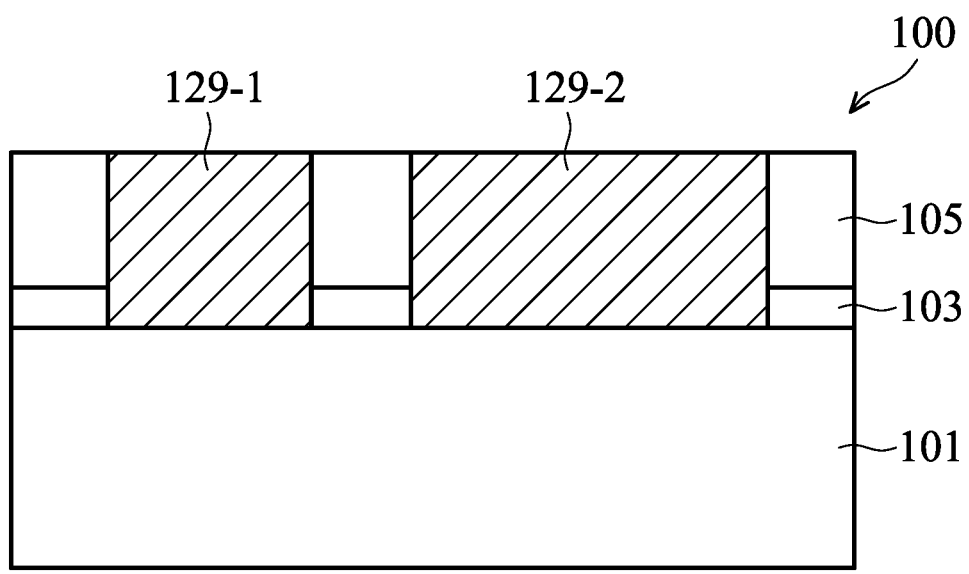

Still in block 1021 of the method 1000 and with reference to FIGS. 12A and 12B, the excess portions of the conductive material 127 (and the liner) on the remaining patterned first hard mask 107' are removed to form multiple conductive lines 129 in the dielectric layer 105 and the etch stop layer 103, in accordance with some embodiments. In some embodiments, the excess portions of the conductive material 127 are removed by a planarization process, such as a CMP process. After the CMP process, the remaining patterned first hard mask 107' is also removed. The top surfaces of the conductive lines 129 may be coplanar with the top surface of the dielectric layer 105.

In the embodiments of the disclosure, the conductive lines 129 are formed by a line cut process. The line-shaped opening 121 of the patterned photo-resist 119 for forming one conductive line is cut by the third hard mask portion 117' (as shown in FIG. 8A). As a result, one conductive line is cut into two sub-conductive lines, for example the conductive lines 129-1 and 129-2 as shown in FIG. 12A in accordance with some embodiments. The two adjacent conductive lines 129-1 and 129-2 are aligned in their longitudinal axes. The left conductive line 129-1 has a concave line-end LE1 that faces another concave line-end LE2 of the right conductive line 129-2. The concave line-ends LE1 and LE2 define a line end space 130 between the conductive lines 129-1 and 129-2.

When compared with the line end space between conductive lines having convex line-ends formed by lithography and OPC technology, the line end space 130 between the conductive lines 129-1 and 129-2 of the embodiments of the disclosure is reduced. The conductive lines 129-1 and 129-2 formed by the line cut process of the embodiments of the disclosure have the concave line-ends LE1 and LE2, respectively. In some instances, the line end space 130 of the embodiments of the disclosure may be reduced by greater than about 50% of the line end space between the conductive lines having convex line-ends formed by lithography and OPC technology. For example, at the technology node of N7, the line end space formed by lithography and OPC technology may be greater than about 50 nm, and the line end space 130 of the embodiments of the disclosure may be smaller than about 25 nm. Therefore, the embodiments of the disclosure can increase conductive lines' routing density for die size reduction and are suitable for IC technology nodes of N20, N16, N10, N7 and beyond.

According to the embodiments of the disclosure, the conductive lines 129 are formed by a line cut process that uses multiple depositing, lithography and etching processes to form the concave line-ends LE1 and LE2 of the conductive lines 129-1 and 129-2, respectively, for example. The line end space 130 between the conductive lines 129 can be minimized by the line cut process of the embodiments of the disclosure. In addition, there is no need to consider etching bias and patterning variation in the line cut process. Therefore, the conductive lines' routing efficiency is enhanced.

Figure 13A:
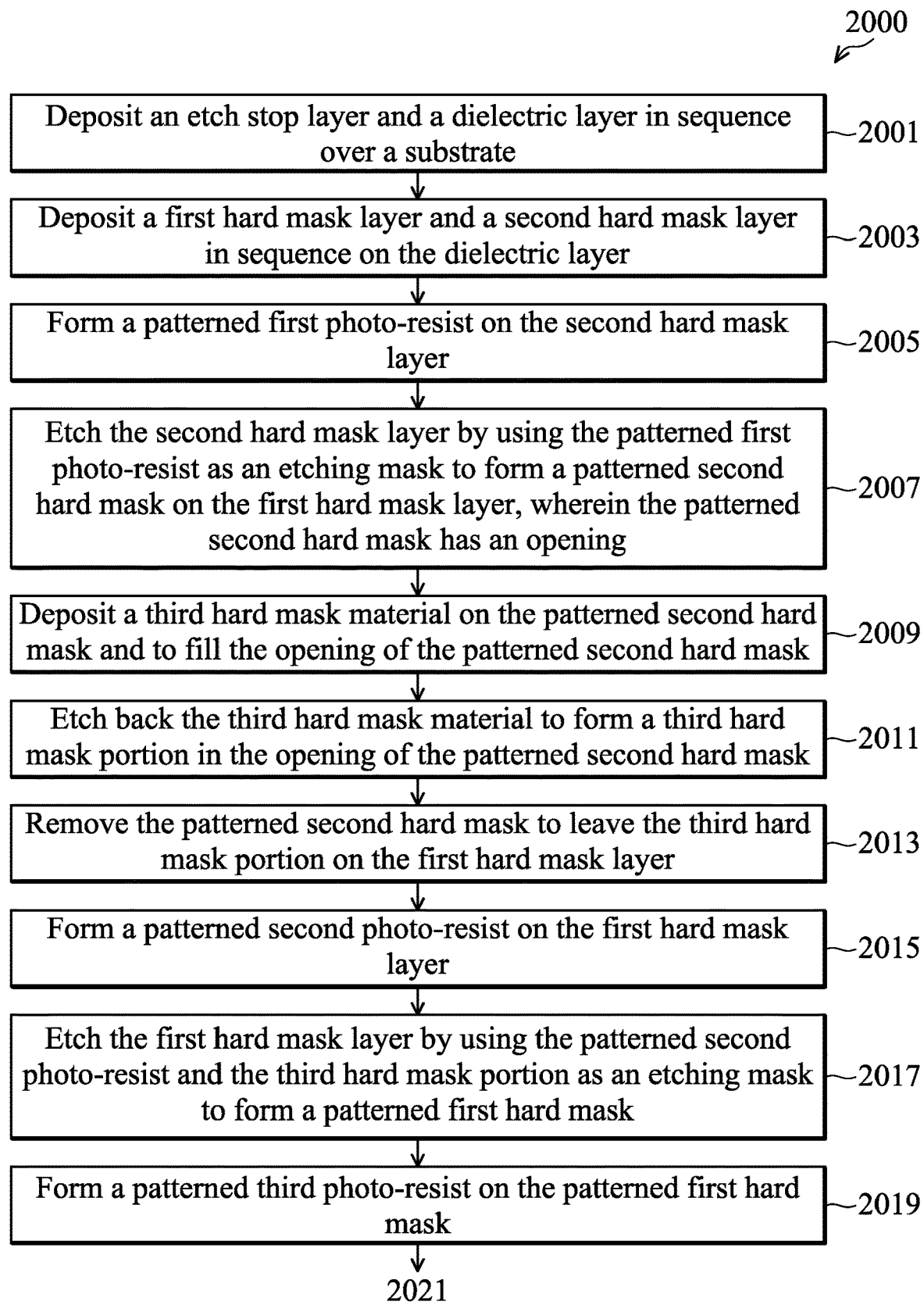
FIGS. 13A and 13B are a flow chart of an exemplary method of fabricating an integrated circuit device, in accordance with some embodiments.
Figure 13B:
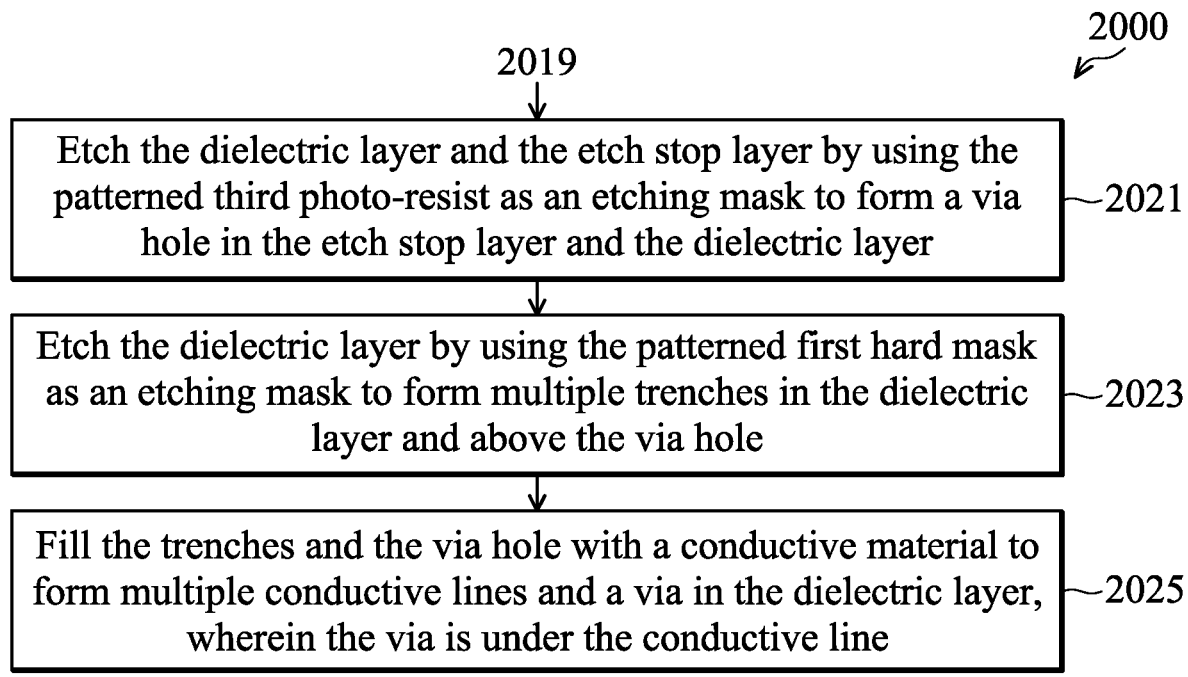

FIGS. 13A and 13B are a flow chart of an exemplary method 2000 of fabricating an integrated circuit device, in accordance with some embodiments. FIGS. 14A, 15A, 16A, 17A and 18A are top views of intermediate structures at various stages of an exemplary method for fabricating an integrated circuit device 200, following the intermediate structure of FIG. 9A, in accordance with some embodiments. In addition, FIGS. 14B, 15B, 16B, 17B and 18B are cross-sectional views of intermediate structures at various stages of the exemplary method for fabricating the integrated circuit device 200, following the intermediate structure of FIG. 9B, in accordance with some embodiments, along line B-B in FIGS. 14A, 15A, 16A, 17A and 18A, respectively.

In some embodiments, blocks 2001 to 2017 of the method 2000 are the same as or similar to those described above in blocks 1001 to 1017 of the method 1000, and with reference to FIGS. 2A to 9A and FIGS. 2B to 9B.

Figure 14A:
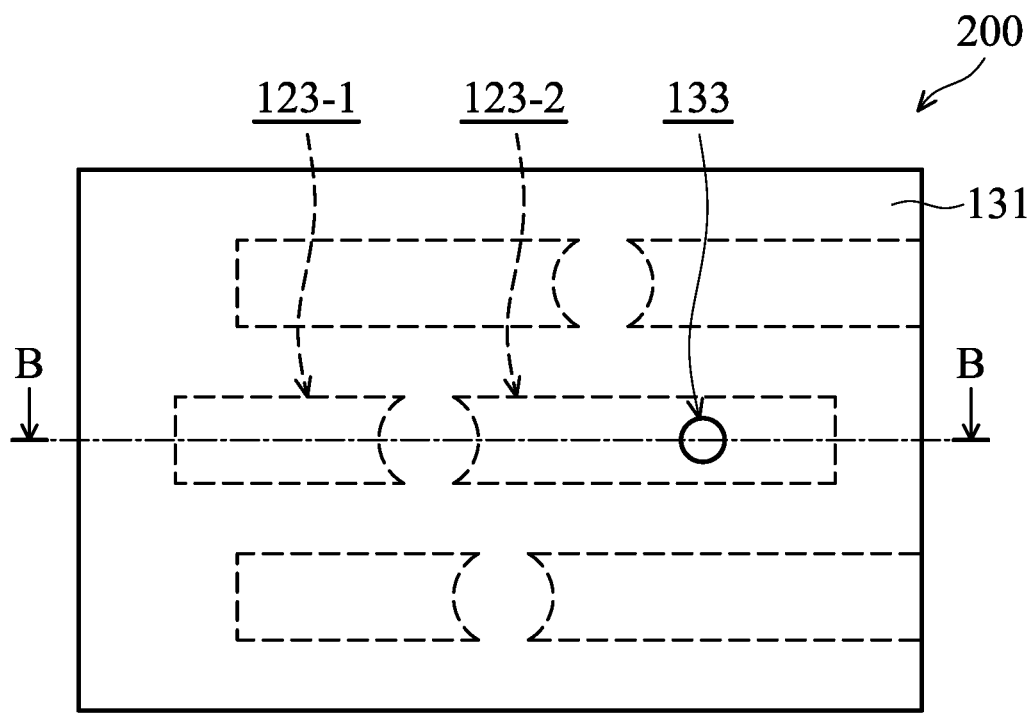
FIGS. 14A, 15A, 16A, 17A and 18A are top views of intermediate structures at various stages of an exemplary method for fabricating an integrated circuit device, in accordance with some embodiments.
Figure 14B:
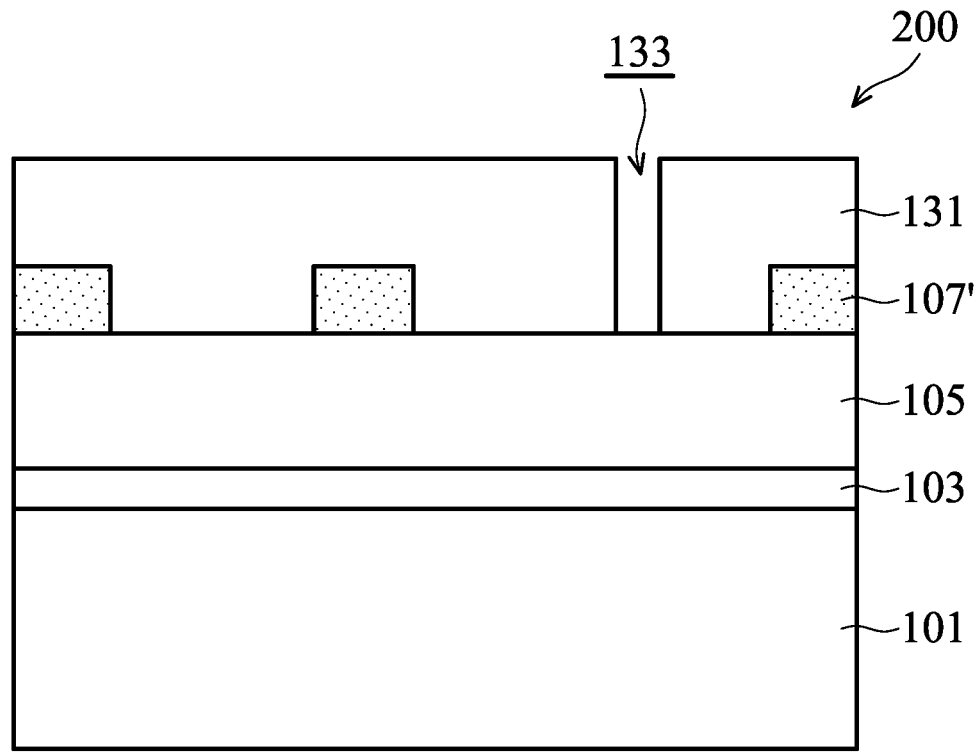
FIGS. 14B, 15B, 16B, 17B and 18B are cross-sectional views of intermediate structures at various stages of an exemplary method for fabricating an integrated circuit device, in accordance with some embodiments, along line B-B in FIGS. 14A, 15A, 16A, 17A and 18A, respectively.

In block 2019 of the method 2000, a patterned third photo-resist is formed on the patterned first hard mask. Referring to FIGS. 14A and 14B, a patterned photo-resist 131 is formed on the patterned first hard mask 107' and the dielectric layer 105, in accordance with some embodiments. The patterned photo-resist 131 covers the patterned first hard mask 107' and has an opening 133 to expose a portion of the dielectric layer 105. The opening 133 is located in the region of the line-shaped opening 123-2 of the patterned first hard mask 107' (FIG. 9A). The opening 133 may have a shape of via, for example a circle that is smaller than the circle of the third hard mask portion 117' (FIG. 8A).

Figure 15A:
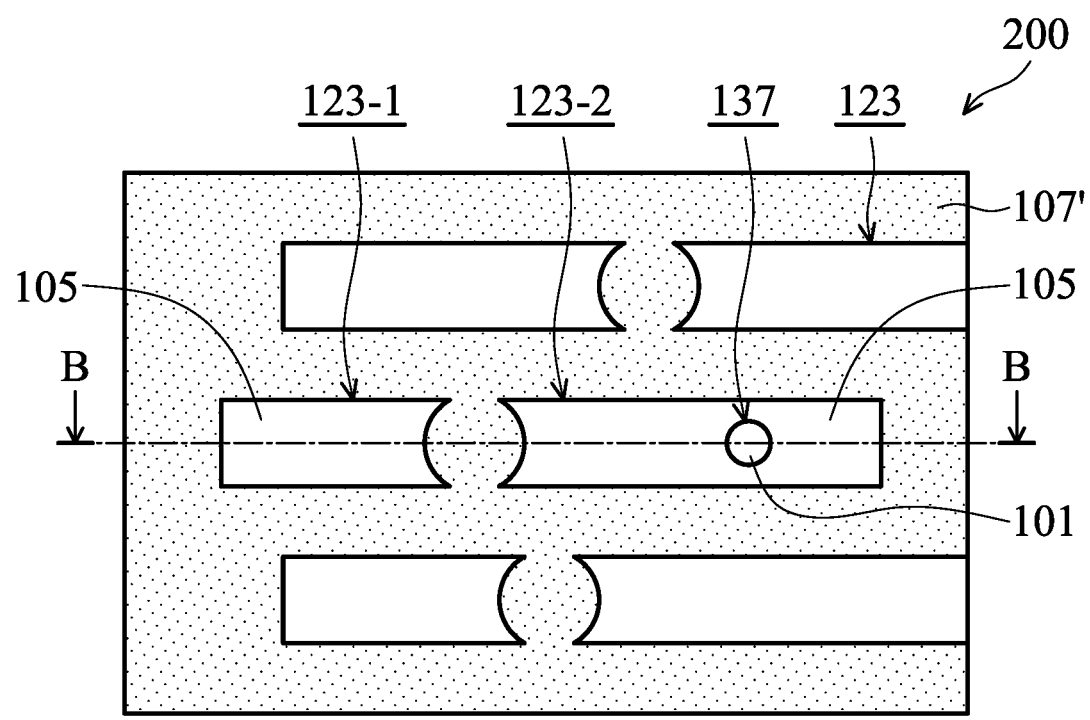
Figure 15B:
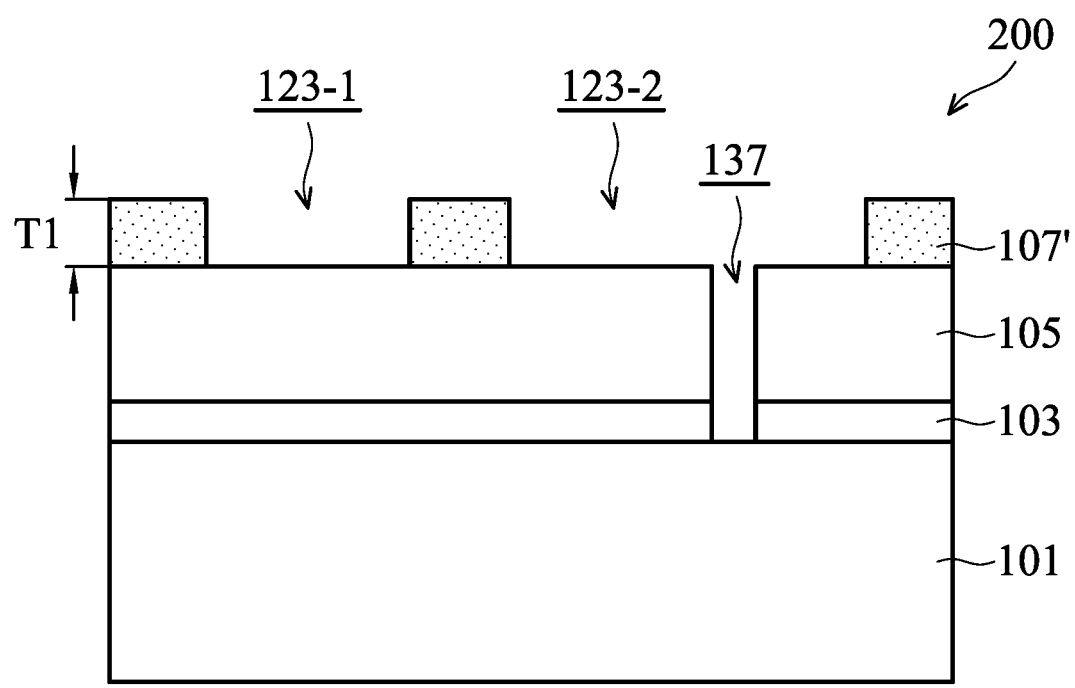

In block 2021 of the method 2000, the dielectric layer and the etch stop layer are etched by using the patterned third photo-resist as an etching mask to form a via hole in the etch stop layer and the dielectric layer. Referring to FIGS. 15A and 15B, the dielectric layer 105 and the etch stop layer 103 are etched to form a via hole 137, in accordance with some embodiments. The via hole 137 is formed by using the patterned photo-resist 119 as an etching mask to etch the dielectric layer 105 and the etch stop layer 103. The via hole 137 passes through the dielectric layer 105 and the etch stop layer 103 to expose a portion of the substrate 101. The dielectric layer 105 and the etch stop layer 103 may be etched by one or more etching processes. The etching process may include a wet etch, a dry etch or a combination thereof. After the via hole 137 is formed, the patterned photo-resist 119 is removed by a wet stripping or a plasma ashing process.

Figure 16A:
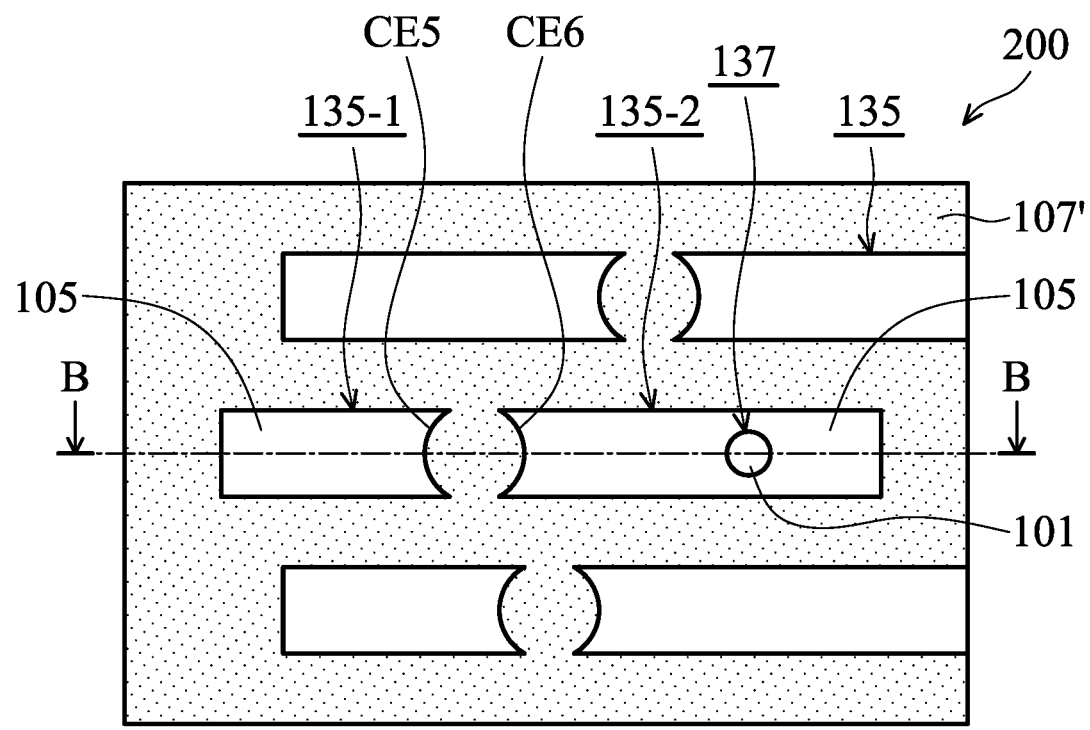
Figure 16B:
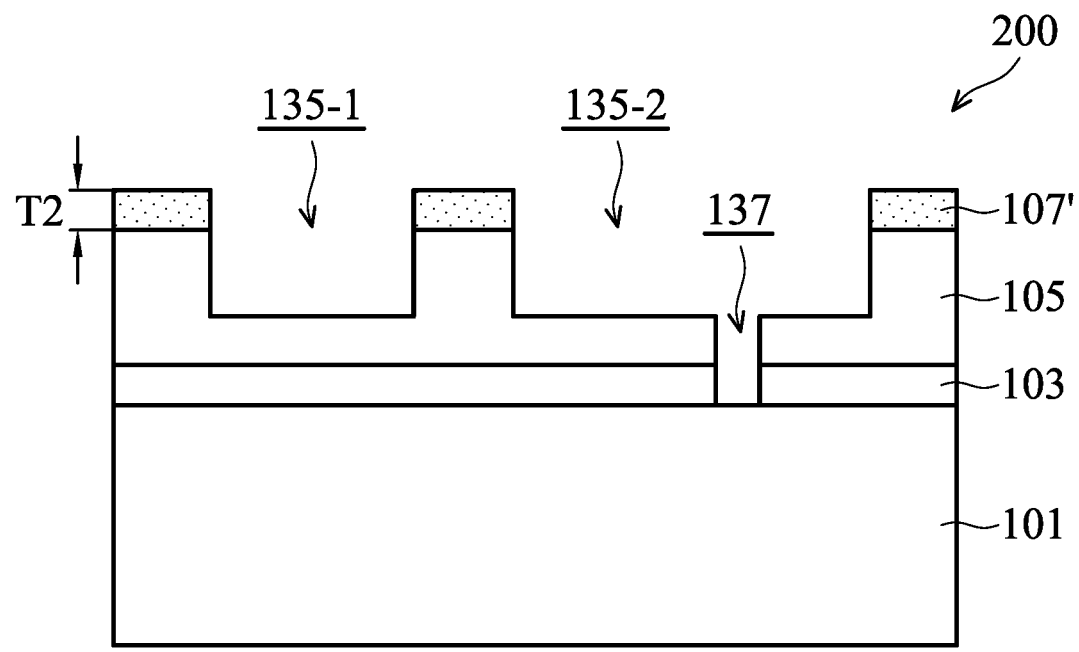

In block 2023 of the method 2000, the dielectric layer is etched by using the patterned first hard mask as an etching mask to form multiple trenches in the dielectric layer and above the via hole. Referring to FIGS. 16A and 16B, the dielectric layer 105 is etched to form multiple trenches 135 by using the patterned first hard mask 107' as an etching mask, in accordance with some embodiments. The trenches 135 are formed by transferring the pattern of the line-shaped openings 123 of the patterned first hard mask 107' (FIG. 15A) to the dielectric layer 105. Therefore, the trenches 135 also have concave line-ends.

In some embodiments, the left trench 135-1 has a concave end CE5 that faces another concave end CE6 of the right trench 135-2. The trenches 135 are formed in the dielectric layer 105 and do not pass through the dielectric layer 105. In addition, one of the trenches 135, such as the right trench 135-2 is connected to the via hole 137. The right trench 135-2 is located directly above the via hole 137, which can be used in a dual damascene process for forming a conductive line and a via.

In some embodiments, the dielectric layer 105 is etched by a wet etch process, a dry etch process or a combination thereof. In some examples, the dry etch process may be performed with fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some examples, after the etching process, the patterned first hard mask 107' remains on the dielectric layer 105. The remaining patterned first hard mask 107' has a thickness T2 that is less than the thickness T1 (FIG. 15B) of the patterned first hard mask 107' before the etching process. In some other examples, after the etching process, the patterned first hard mask 107' is removed from the dielectric layer 105.

Figure 17A:
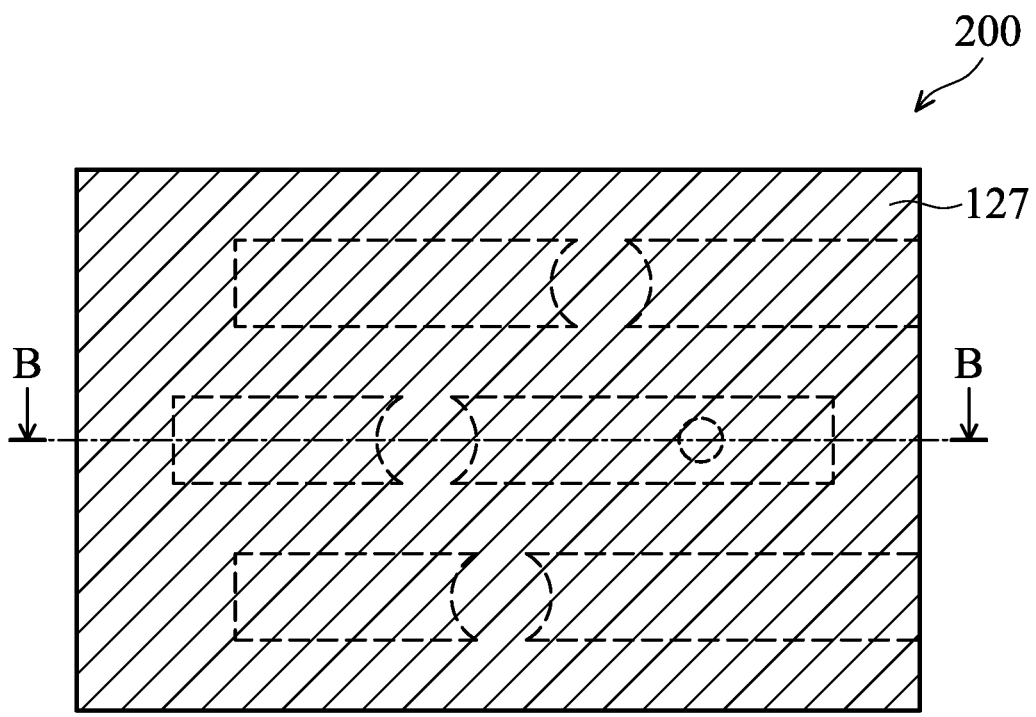
Figure 17B:
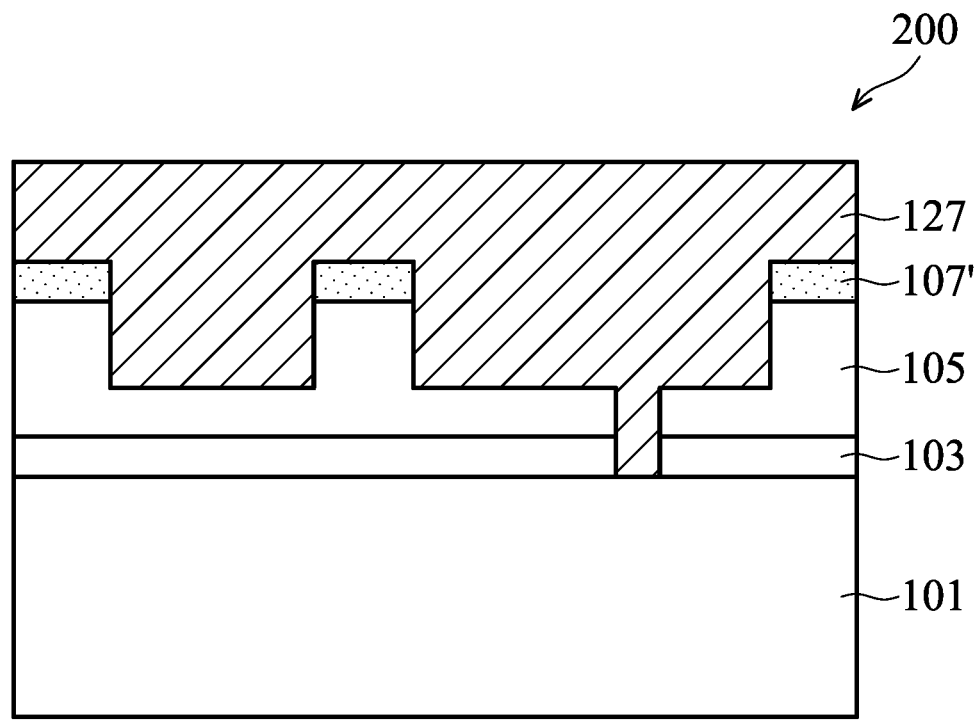

In block 2025 of the method 2000, the trenches and the via hole are filled with a conductive material to form multiple conductive lines and a via in the dielectric layer, wherein the via is under the conductive line. Referring to FIGS. 17A and 17B, a conductive material 127 is deposited on the remaining patterned first hard mask 107' and to fill the trenches 135 and the via hole 137 in the dielectric layer 105 and the etch stop layer 103, in accordance with some embodiments. In some examples, the conductive material 127 and the process for depositing the conductive material 127 may be the same as or similar to those described above with respect to the conductive material 127 of FIGS. 11A and 11B.

Figure 18A:
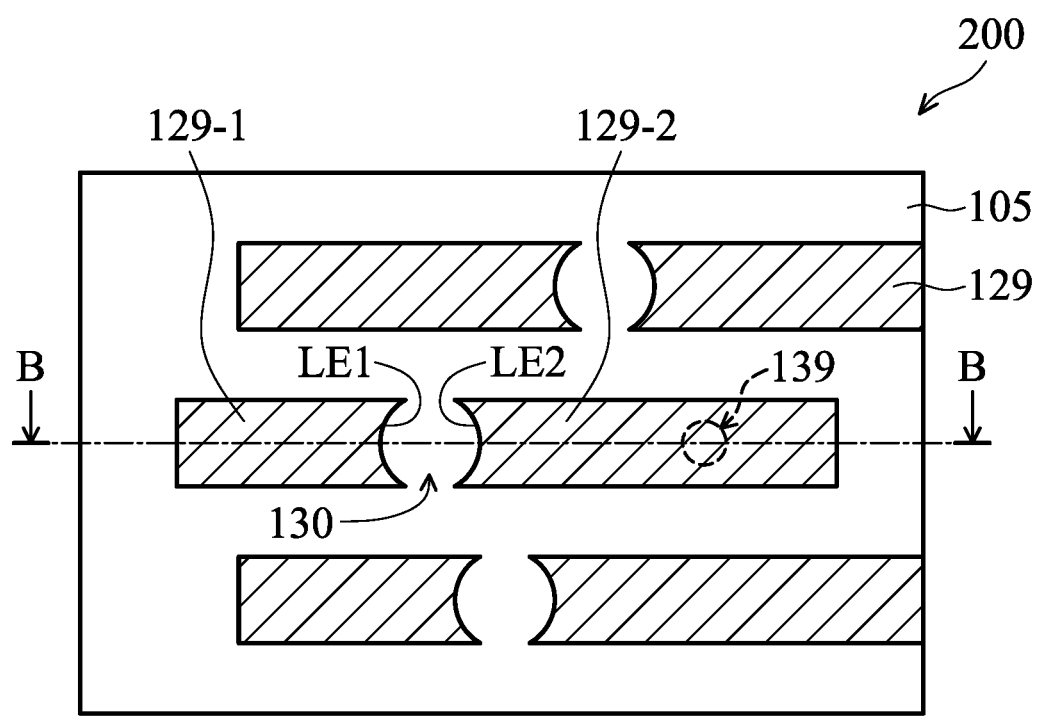
Figure 18B:
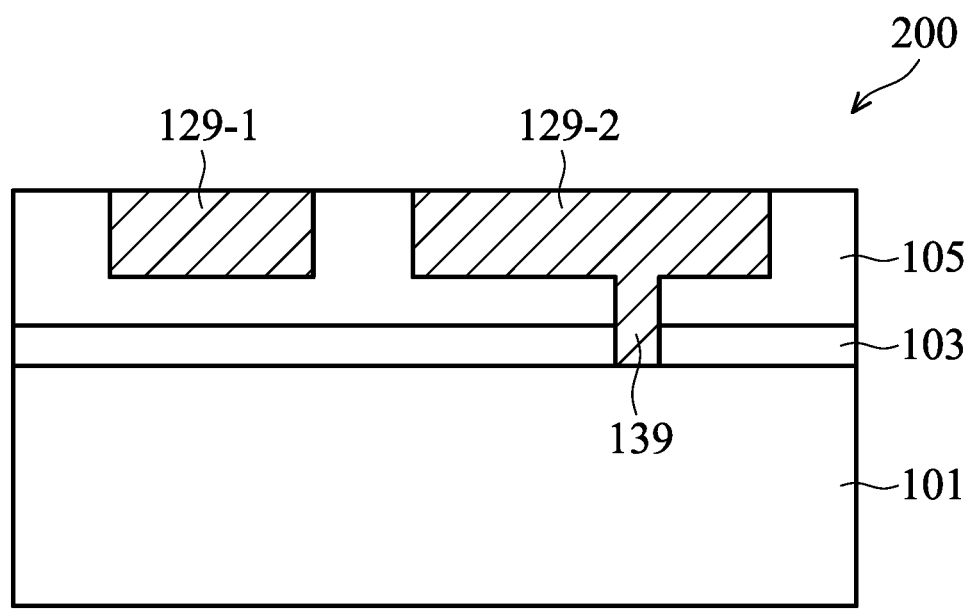

Still in block 2025 of the method 2000 and with reference to FIGS. 18A and 18B, the excess portions of the conductive material 127 on the remaining patterned first hard mask 107' is removed to form multiple conductive lines 129 and a via 139 in the dielectric layer 105 and the etch stop layer 103, in accordance with some embodiments. In some embodiments, the excess portions of the conductive material 127 are removed by a planarization process, such as a CMP process. After the CMP process, the remaining patterned first hard mask 107' is also removed. The top surfaces of the conductive lines 129 may be coplanar with the top surface of the dielectric layer 105. Moreover, in the embodiments of the disclosure, the via 139 is formed under, and is connected to, one of the conductive lines 129, for example the conductive line 129-2, in the dual damascene process.

In the embodiments of the disclosure, the conductive lines 129 are also formed by a line cut process. The line-shaped opening 121 of the patterned photo-resist 119 for forming one conductive line is cut by the third hard mask portion 117' (as shown in FIG. 8A). As a result, one conductive line is cut into at least two sub-conductive lines, such as the conductive lines 129-1 and 129-2 as shown in FIG. 18A in accordance with some embodiments. The two adjacent conductive lines 129-1 and 129-2 are aligned in their longitudinal axes. The left conductive line 129-1 has a concave line-end LE1 that faces another concave line-end LE2 of the right conductive line 129-2. The concave line-ends LE1 and LE2 define a line end space 130 between the conductive lines 129-1 and 129-2.

According to the embodiments of the disclosure, the conductive lines 129 are formed by a line cut process that uses multiple depositing, lithography and etching processes to form the concave line-ends LE1 and LE2 of the conductive lines 129-1 and 129-2, respectively. In some instances, the line end space 130 between the conductive lines 129 formed by the line cut process may be reduced by greater than about 50% of the line end space between the conductive lines formed by lithography and OPC technology. The line end space 130 between the conductive lines 129 can be minimized by the line cut process. The conductive lines' routing efficiency is thereby enhanced according to the embodiments of the disclosure. Therefore, the embodiments of the disclosure can increase conductive lines' routing density for die size reduction and are suitable for IC technology nodes of N20, N16, N10, N7 and beyond.

Figure 19:
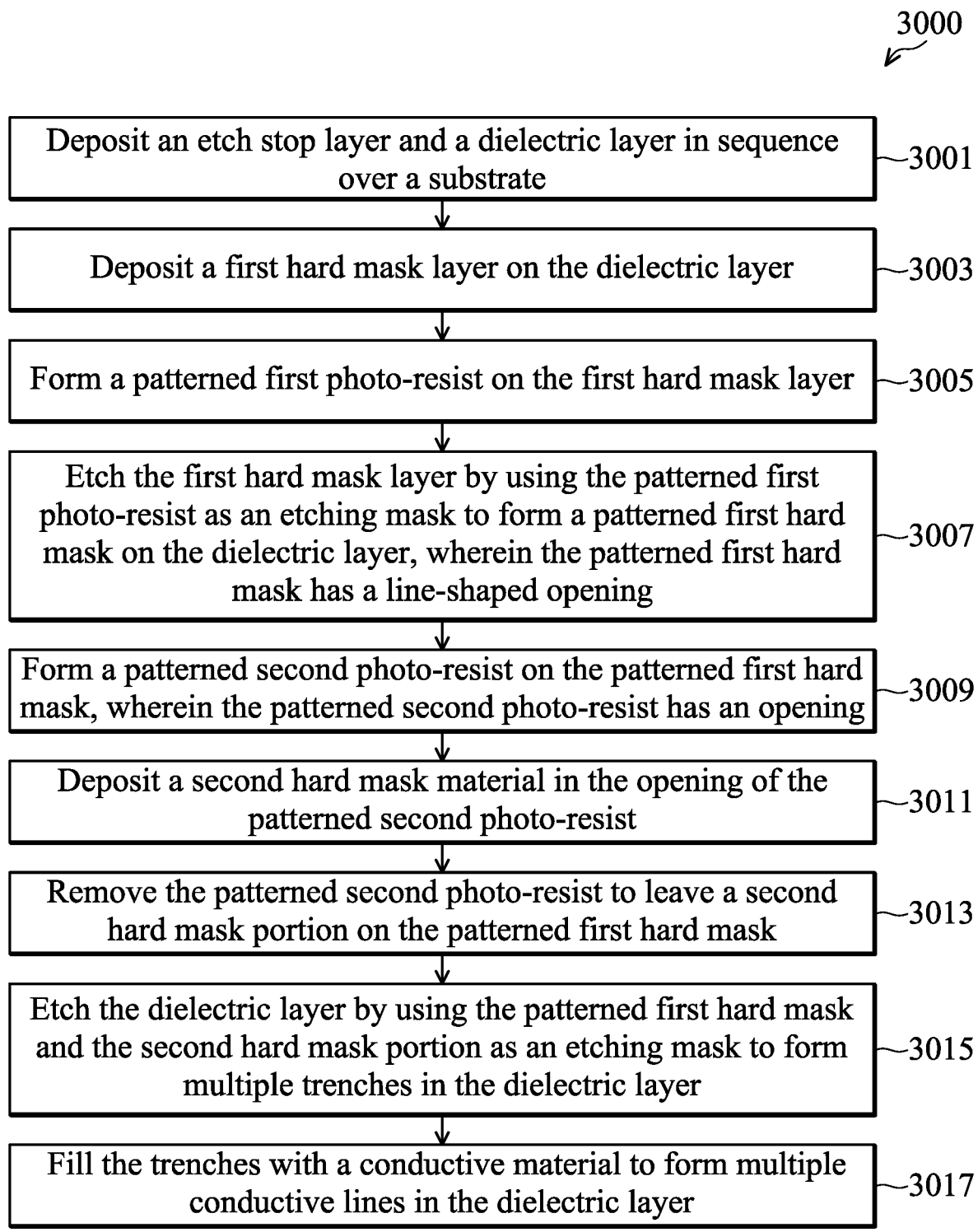
FIG. 19 is a flow chart of an exemplary method of fabricating an integrated circuit device, in accordance with some embodiments.

FIG. 19 is a flow chart of an exemplary method 3000 of fabricating an integrated circuit device, in accordance with some embodiments. FIGS. 20A, 21A, 22A, 23A, 24A, 25A, 26A and 27A are top views of intermediate structures at various stages of an exemplary method for fabricating an integrated circuit device 300, in accordance with some embodiments. In addition, FIGS. 20B, 21B, 22B, 23B, 24B, 25B, 26B, and 27B are cross-sectional views of intermediate structures at various stages of the exemplary method for fabricating the integrated circuit device 300, in accordance with some embodiments, along line B-B in FIGS. 20A, 21A, 22A, 23A, 24A, 25A, 26A and 27A, respectively.

Figure 20A:
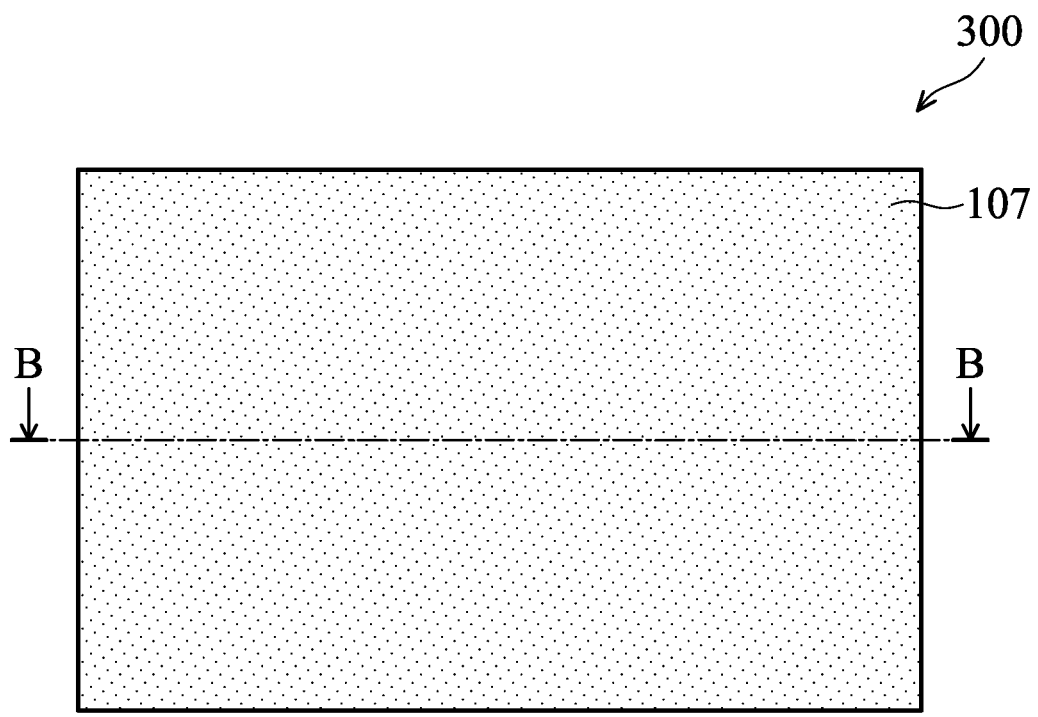
FIGS. 20A, 21A, 22A, 23A, 24A, 25A, 26A and 27A are top views of intermediate structures at various stages of an exemplary method for fabricating an integrated circuit device, in accordance with some embodiments.
Figure 20B:
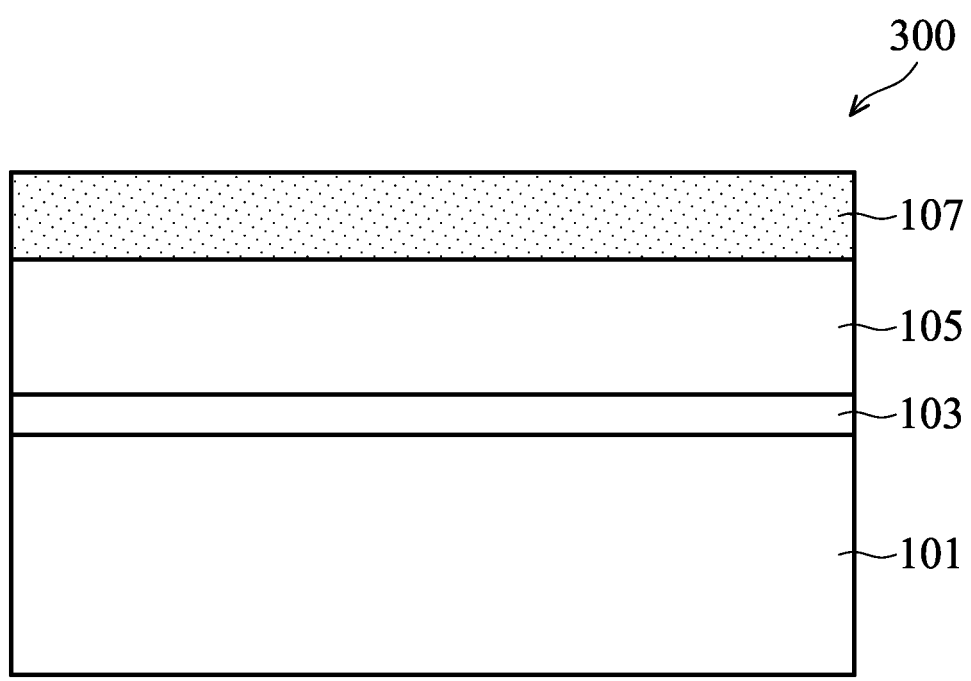
FIGS. 20B, 21B, 22B, 23B, 24B, 25B, 26B and 27B are cross-sectional views of intermediate structures at various stages of an exemplary method for fabricating an integrated circuit device, in accordance with some embodiments, along line B-B in FIGS. 20A, 21A, 22A, 23A, 24A, 25B, 26B and 27B, respectively.

In block 3001 of the method 3000, an etch stop layer and a dielectric layer are deposited in sequence over a substrate. Moreover, in block 3003 of the method 3000, a first hard mask layer is deposited on the dielectric layer. Referring to FIG. 20B, a substrate 101 is provided, and an etch stop layer 103, a dielectric layer 105 and a first hard mask layer 107 are deposited in sequence over the substrate 101, in accordance with some embodiments. FIG. 20A shows a top view of the first hard mask layer 107 at a stage of an exemplary method for fabricating the integrated circuit device 300, in accordance with some embodiments. FIG. 20B shows a cross-sectional view of an intermediate structure along line B-B in FIG. 20A for fabricating the integrated circuit device 300, in accordance with some embodiments.

In some embodiments, the materials and the processes for forming the substrate 101, the etch stop layer 103, the dielectric layer 105 and the first hard mask layer 107 may be the same as or similar to those described above with respect to the substrate 101, the etch stop layer 103, the dielectric layer 105 and the first hard mask layer 107 of FIGS. 2A and 2B.

Figure 21A:
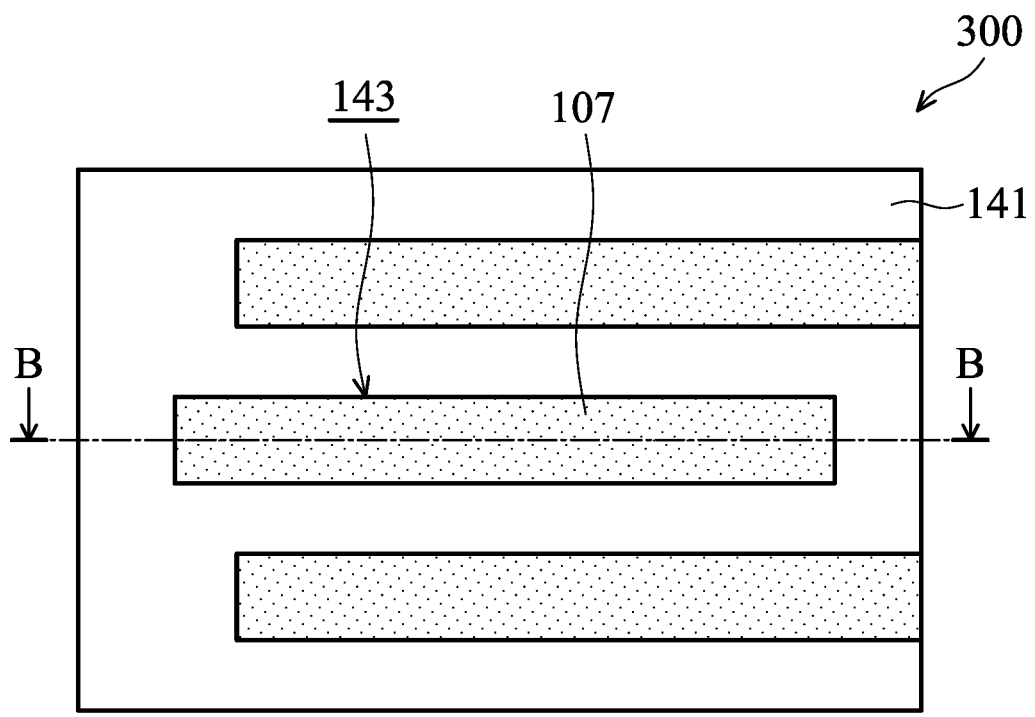
Figure 21B:
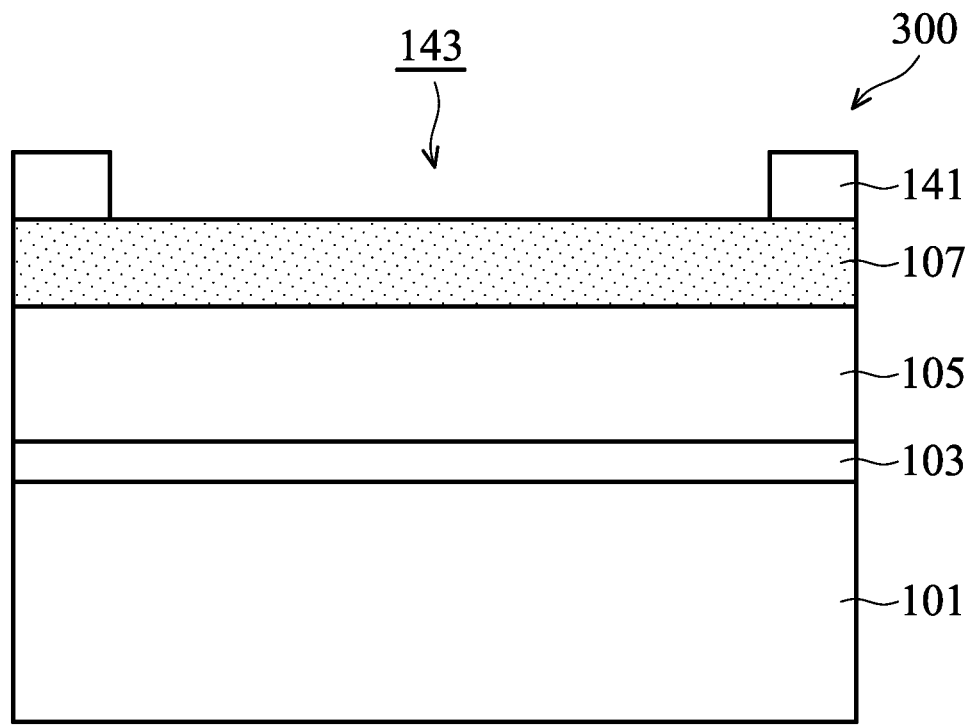

In block 3005 of the method 3000, a patterned first photo-resist is formed on the first hard mask layer. Referring to FIGS. 21A and 21B, a patterned photo-resist 141 is formed on the first hard mask layer 107, in accordance with some embodiments. The patterned photo-resist 141 has multiple line-shaped openings 143. Some portions of the first hard mask layer 107 are exposed through the line-shaped openings 143 of the patterned photo-resist 141.

Figure 22A:
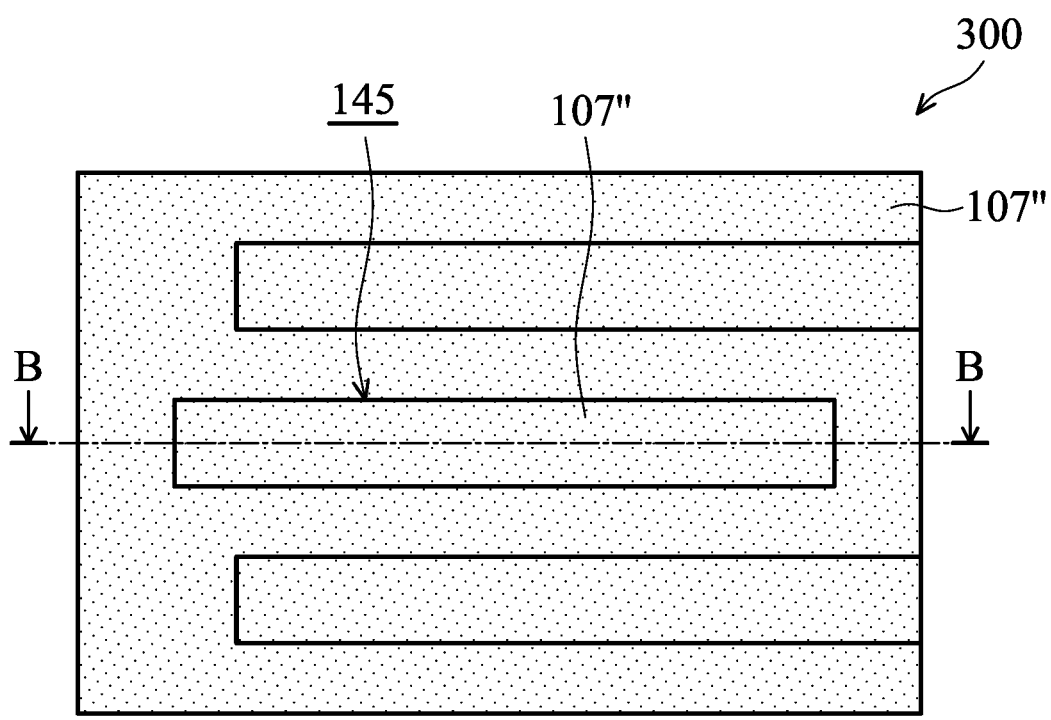
Figure 22B:
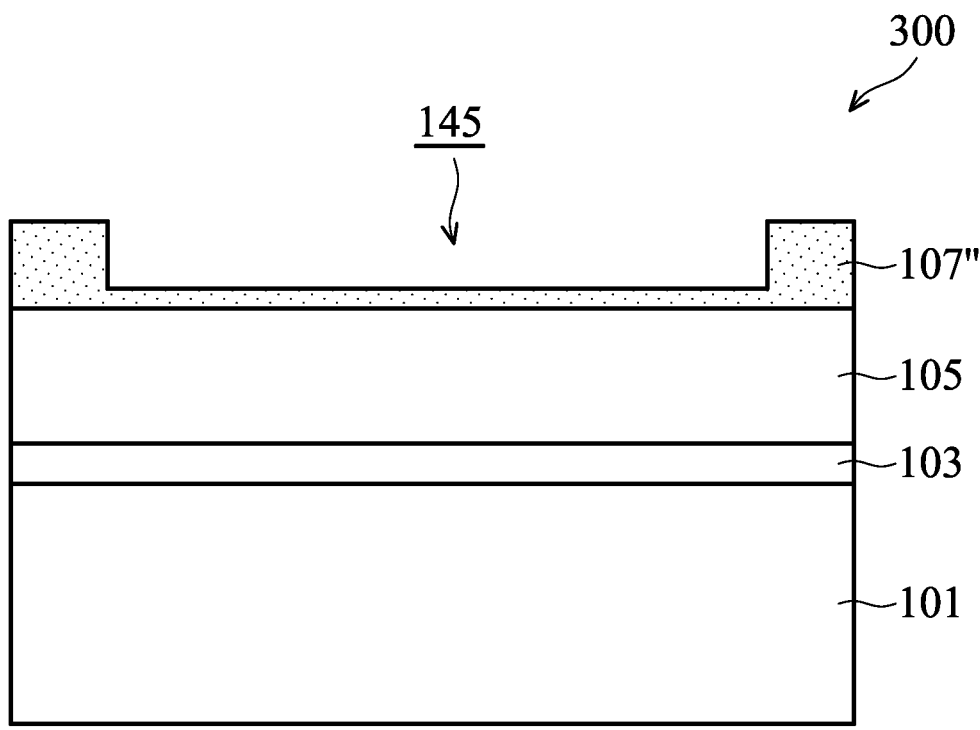

In block 3007 of the method 3000, the first hard mask layer is etched by using the patterned first photo-resist as an etching mask to form a patterned first hard mask on the dielectric layer, wherein the patterned first hard mask has a line-shaped opening. Referring to FIGS. 22A and 22B, the first hard mask layer 107 is etched to form multiple line-shaped openings 145 in a patterned first hard mask 107", in accordance with some embodiments. The line-shaped openings 145 are formed by using the patterned photo-resist 141 as an etching mask to etch the first hard mask layer 107.

In some embodiments, the line-shaped openings 145 do not pass through the first hard mask layer 107. Some portions of the patterned first hard mask 107" remain under the line-shaped openings 145. In some other embodiments, the line-shaped openings 145 may pass through the first hard mask layer 107 to expose some portions of the dielectric layer 105. The first hard mask layer 107 may be etched by a wet etch process, a dry etch process or a combination thereof. The dry etch process may be performed with fluorine-based plasma and uses etch gases, such as $C_4F_8$, $C_4F_6$, $CF_4$, $CHF_3$, $CH_2F_2$, $CH_3F$ or a combination thereof. In some examples, the wet etch process may use a fluoride-based aqueous etch solution, for example diluted hydrofluoric acid (dHF), or a mixture of HCl, $FeCl_3$ and/or $H_2O$. After the line-shaped openings 145 are formed in the patterned first hard mask 107", the patterned photo-resist 141 is removed by a wet stripping or a plasma ashing process.

Figure 23A:
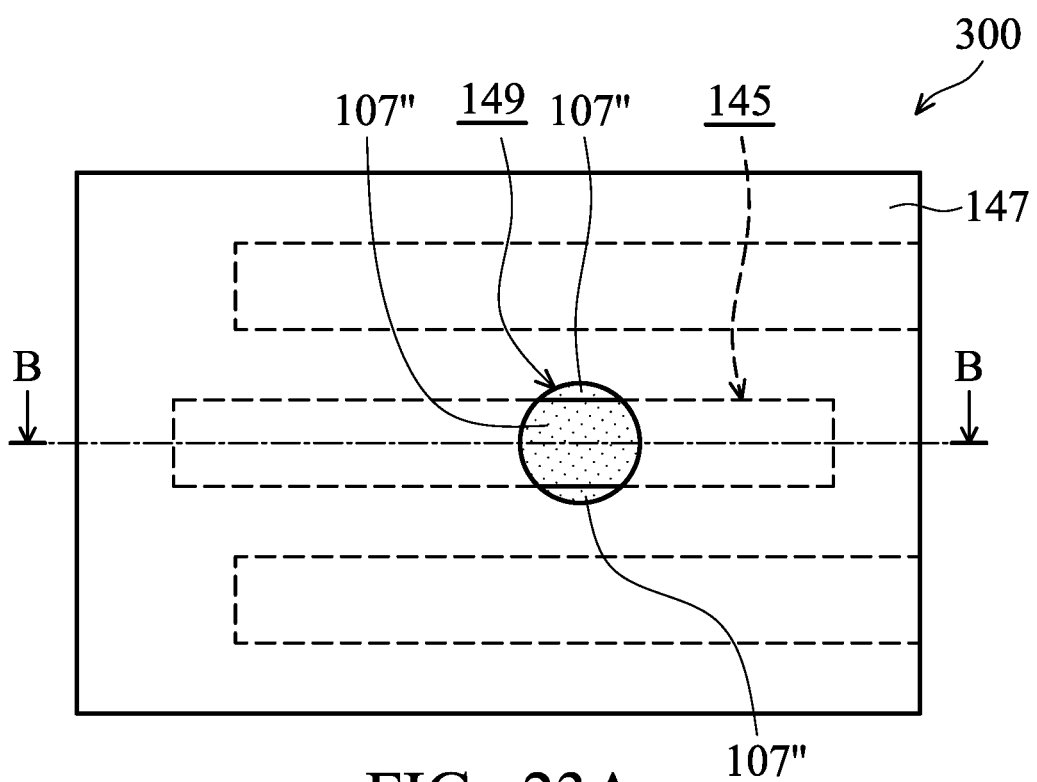
Figure 23B:
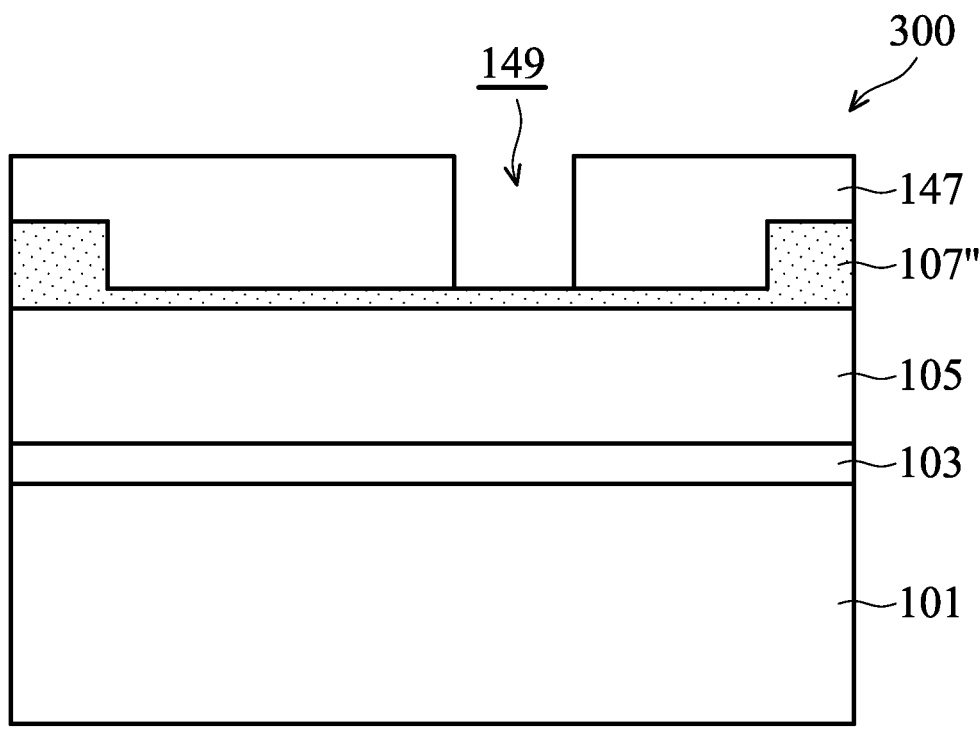

In block 3009 of the method 3000, a patterned second photo-resist is formed on the patterned first hard mask, wherein the patterned second photo-resist has an opening. Referring to FIGS. 23A and 23B, a patterned photo-resist 147 is formed on the patterned first hard mask 107", in accordance with some embodiments. The patterned photo-resist 147 has an opening 149 with the shape of a circle. The opening 149 is located at the region of the line-shaped opening 145. Moreover, two end-portions of the circle of the opening 149 are outside the region of the line-shaped opening 145.

Figure 24A:
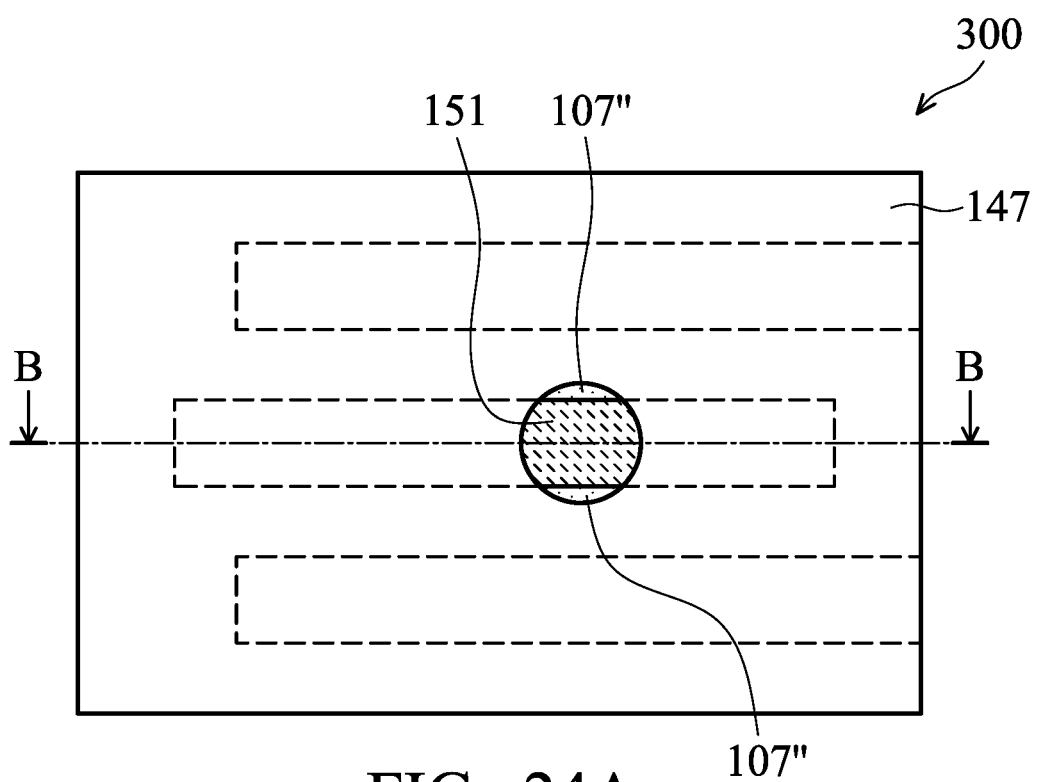
Figure 24B:
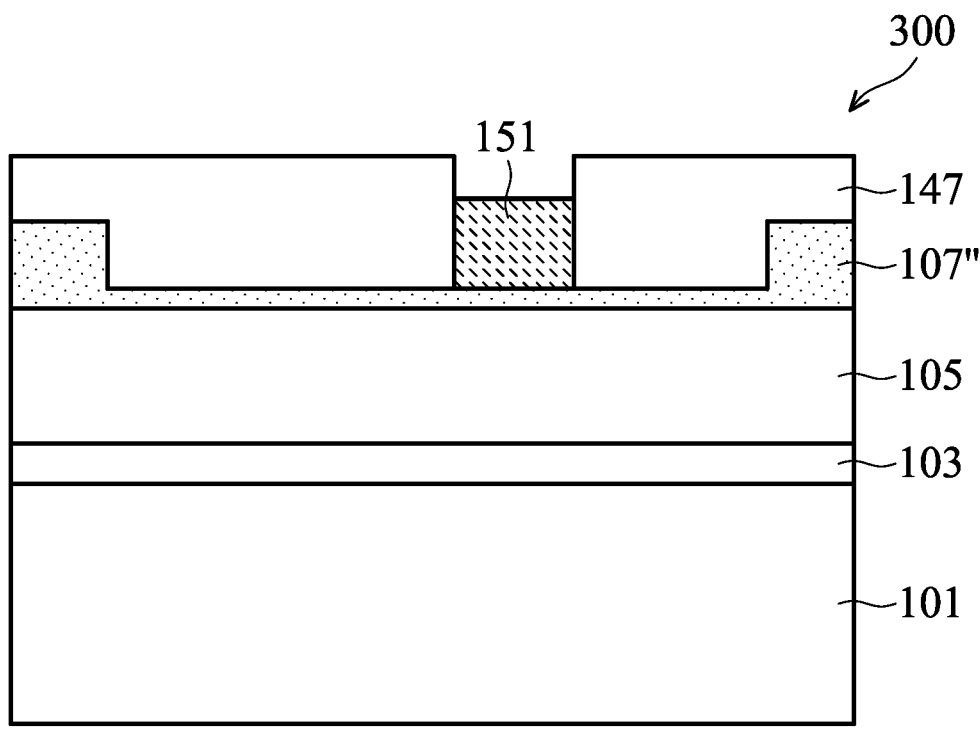

In block 3011 of the method 3000, a second hard mask material is deposited in the opening of the patterned second photo-resist. Referring to FIGS. 24A and 24B, a second hard mask material 151 is deposited in the opening 149 of the patterned photo-resist 147, in accordance with some embodiments. In some embodiments, the second hard mask material 151 is a flowable material during a deposition process. In some examples, the second hard mask material 151 may be a carbon-based spin-on hard mask-like material. The second hard mask material 151 may include silicon oxycarbide (SiOxCy), spin-on-glass (SOG), for example hydrogen silsesquioxane (HSQ), spin-on-polymer, or a combination thereof. The second hard mask material 151 may be deposited by a flowable CVD (FCVD) process or a spin-on coating process.

In some embodiments, the opening 149 of the patterned photo-resist 147 is not completely filled with the second hard mask material 151. The second hard mask material 151 fills in a portion of the line-shaped opening 145 that is exposed through the opening 149 (shown in FIG. 24A). In some examples, the top surface of the second hard mask material 151 in the opening 149 is lower than (shown in FIG. 24B) or coplanar with the top surface of the patterned photo-resist 147.

Figure 25A:
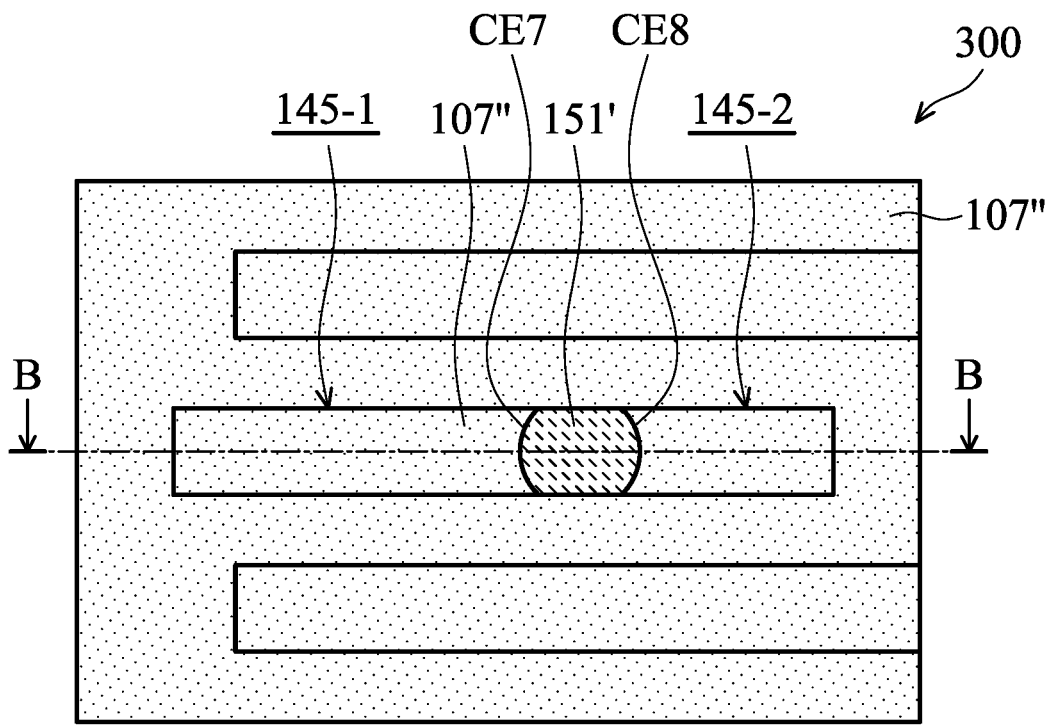
Figure 25B:
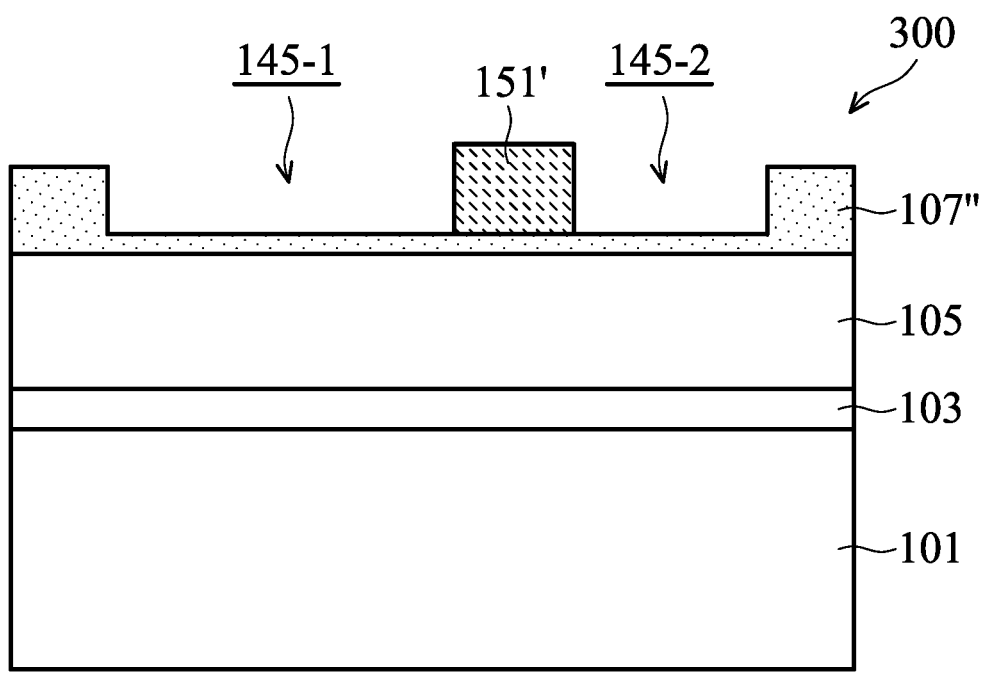

In block 3013 of the method 3000, the patterned second photo-resist is removed to leave a second hard mask portion on the patterned first hard mask. Referring to FIGS. 25A and 25B, the second hard mask material 151 is cured to form a second hard mask portion 151' that remains on the patterned first hard mask 107'', and then the patterned photo-resist 147 is removed. The patterned photo-resist 147 may be removed by a wet stripping or a plasma ashing process. In the embodiments, the line-shaped opening 145 of FIGS. 22A and 22B is separated by the second hard mask portion 151' into two line-shaped openings 145-1 and 145-2 of FIGS. 25A and 25B. The second hard mask portion 151' has a circle-like shape, and the line-shaped openings 145-1 and 145-2 have concave ends CE7 and CE8, respectively. In addition, the opening 149 of the patterned photo-resist 147 has the shape of a circle, and the second hard mask portion 151' has the shape of a portion of the circle that overlaps the line-shaped opening 145 of the patterned first hard mask 107''.

Figure 26A:
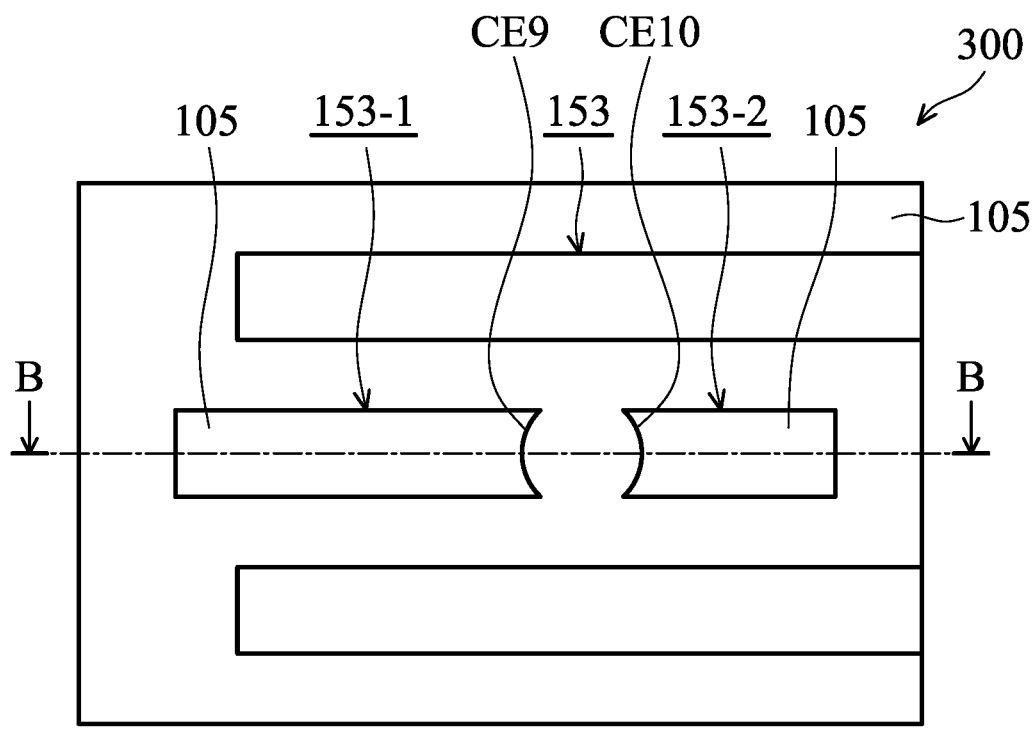
Figure 26B:
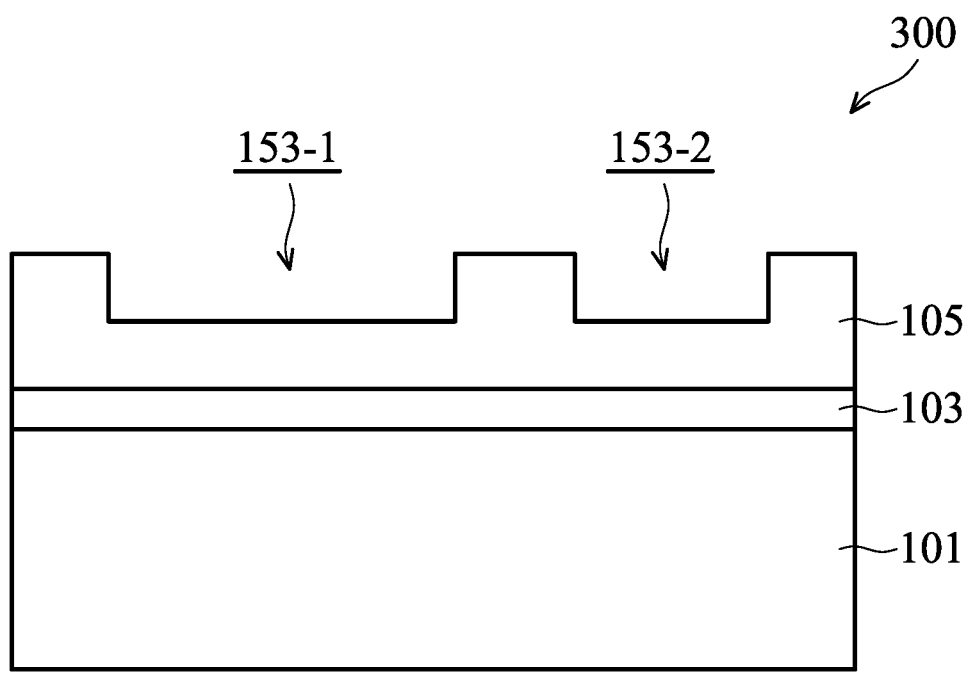

In block 3015 of the method 3000, the dielectric layer is etched by using the patterned first hard mask and the second hard mask portion as an etching mask to form multiple trenches in the dielectric layer. Referring to FIGS. 26A and 26B, the dielectric layer 105 is etched to form multiple trenches 153, 153-1 and 153-2 by using the second hard mask portion 151' and the patterned first hard mask layer 107'' (FIGS. 25A and 25B) as an etching mask, in accordance with some embodiments. The trenches 153-1 and 153-2 are formed by transferring the pattern of the line-shaped openings 145-1 and 145-2 (FIG. 25A) to the dielectric layer 105. Therefore, the trenches 153-1 and 153-2 also have concave ends CE9 and CE10, respectively. In some embodiments, the concave end CE9 of the left trench 153-1 faces the concave end CE10 of the right trench 153-2. The trenches 153-1 and 153-2 are formed in the dielectric layer 105 and do not pass through the dielectric layer 105. The dielectric layer 105 may be etched by a wet etch process, a dry etch process or a combination thereof. The etching process for the dielectric layer 105 may be the same as or similar to those described above with respect to the etching process of FIG. 16B.

Figure 27A:
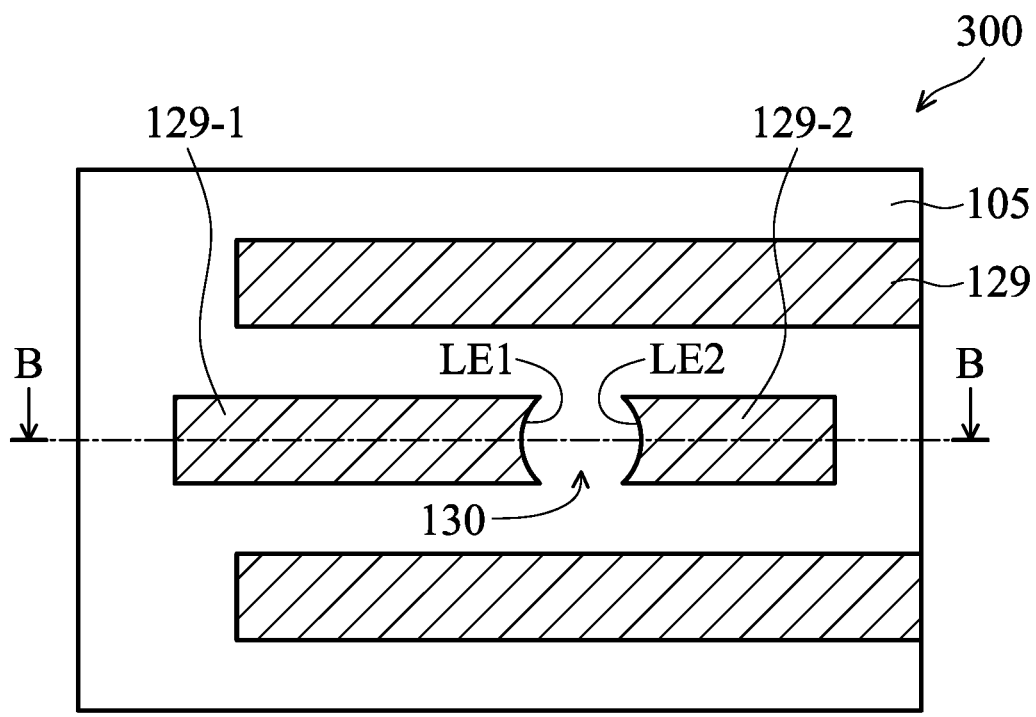
Figure 27B:
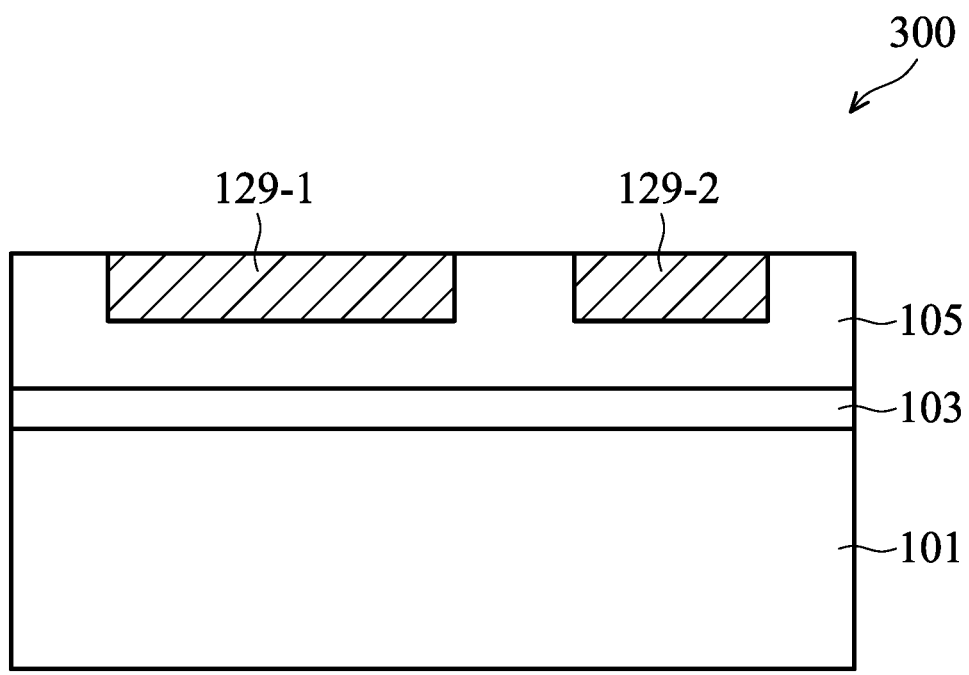

In block 3017 of the method 3000, the trenches are filled with a conductive material to form multiple conductive lines in the dielectric layer. Referring to FIGS. 27A and 27B, the trenches 153, 153-1 and 153-2 of the dielectric layer 105 are filled with a conductive material to form multiple conductive lines 129, 129-1 and 129-2, in accordance with some embodiments. In some examples, the conductive material and the process for forming the conductive lines 129, 129-1 and 129-2 may be the same as or similar to those described above with respect to the conductive lines 129-1 and 129-2 of FIGS. 17B and 18B.

In the embodiments of the disclosure, the conductive lines 129-1 and 129-2 are formed by a line cut process that uses the second hard mask portion 151' to separate one line-shaped opening 145 of FIGS. 22A and 22B into two line-shaped openings 145-1 and 145-2 of FIGS. 25A and 25B. Thereafter, the patterns of the line-shaped openings 145-1 and 145-2 are transferred to the dielectric layer 105 to form the trenches 153-1 and 153-2 for the conductive lines 129-1 and 129-2. As a result, one conductive line is cut into two sub-conductive lines, such as the conductive lines 129-1 and 129-2 as shown in FIG. 27A in accordance with some embodiments.

In some embodiments, the two adjacent conductive lines 129-1 and 129-2 are aligned in their longitudinal axes. The left conductive line 129-1 has a concave line-end LE1 that faces another concave line-end LE2 of the right conductive line 129-2. The concave line-ends LE1 and LE2 define a line end space 130 between the conductive lines 129-1 and 129-2. In some instances, the line end space 130 between the conductive lines 129-1 and 129-2 may be reduced by about 50% of the line end space between the conductive lines having convex line-ends formed by lithography and OPC technology.

Figure 28:
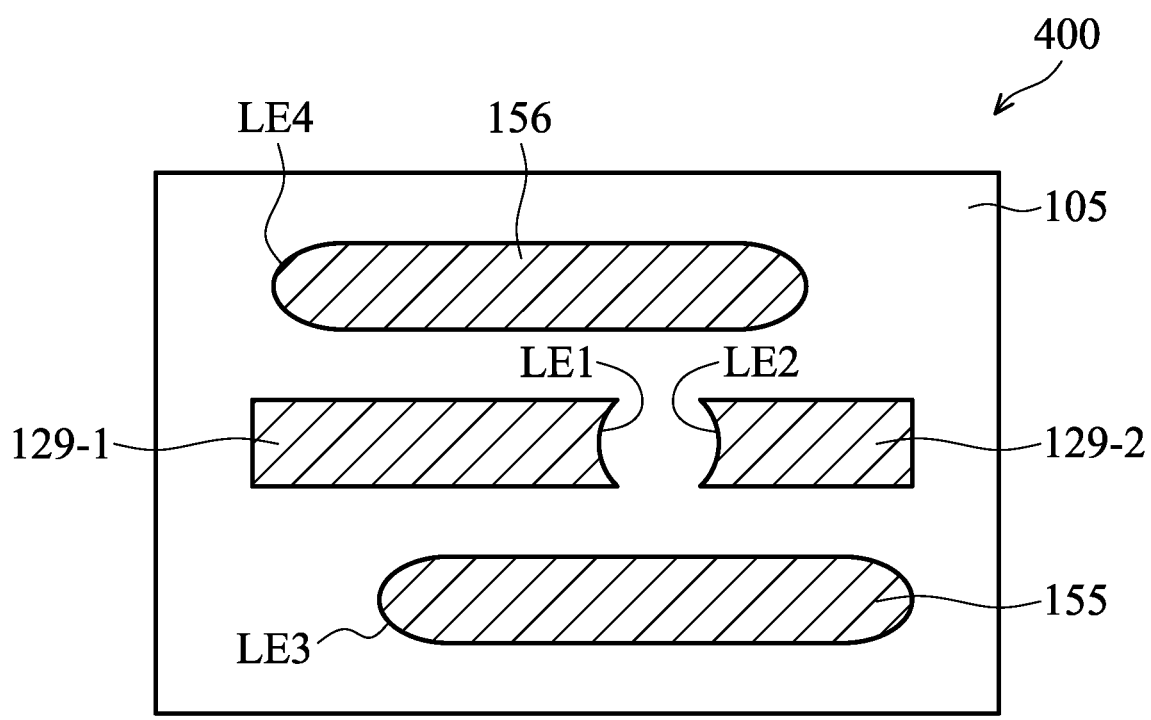
FIG. 28 is a top view of a partial conductive lines layout of an exemplary integrated circuit device, in accordance with some embodiments.

FIG. 28 is a top view of a partial conductive lines layout of an exemplary integrated circuit device 400, in accordance with some embodiments. The conductive lines 129-1 and 129-2 having concave line-ends LE1 and LE2 are collocated with the conductive lines 155 and 156 having convex line-ends LE3 and LE4, respectively, as shown in FIG. 28 in accordance with some embodiments. The conductive lines 129-1 and 129-2 having the concave line-ends LE1 and LE2 may be formed by the exemplary method 1000, 2000 or 3000 for fabricating the integrated circuit device 100, 200 or 300, respectively. The conductive lines 155 and 156 having the convex line-ends LE3 and LE4 may be formed by lithography and OPC technology.

In some embodiments, the conductive lines 129-1 and 129-2, and the conductive lines 155 and 156 may be formed simultaneously in the same step of the fabrication process that uses the same photo mask. In some other embodiments, the conductive lines 129-1 and 129-2, and the conductive lines 155 and 156 may be formed independently in different steps of fabrication processes that use different photo masks. In some examples, the conductive lines 155 and 156 may be arranged in parallel to the conductive lines 129-1 and 129-2. In some examples, the conductive lines 155 and 156 may be arranged along the longitudinal axis of the conductive lines 129-1 and 129-2.

Figure 29:
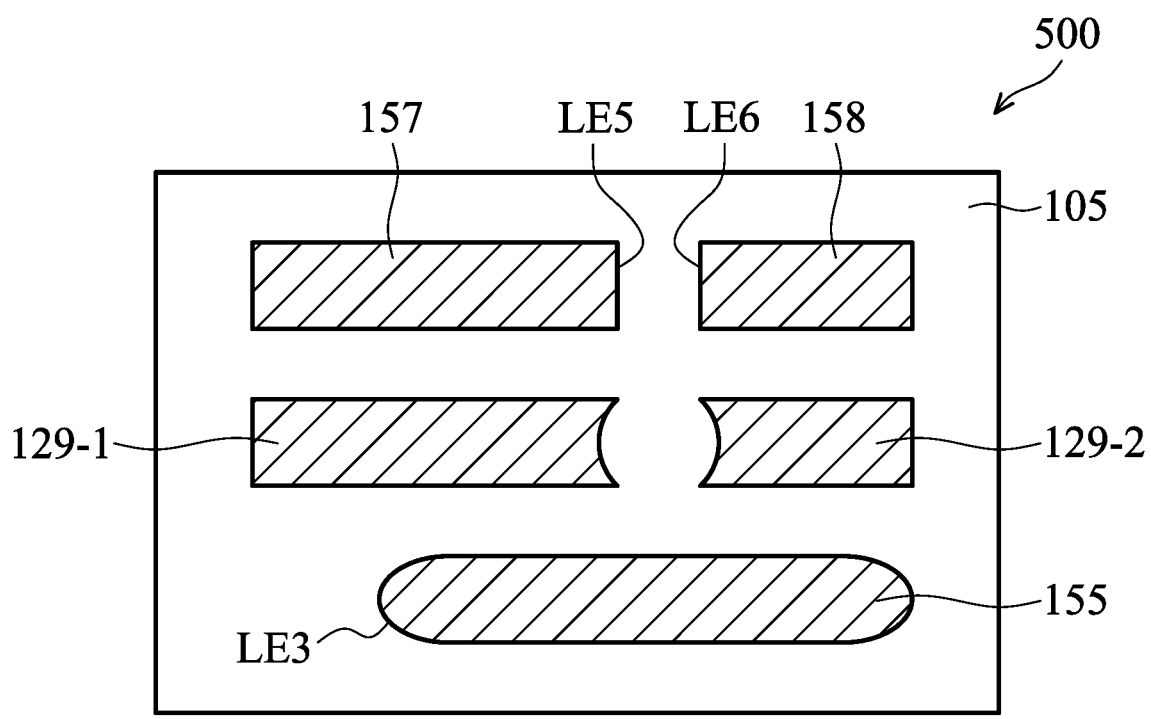
FIG. 29 is a top view of a partial conductive lines layout of an exemplary integrated circuit device, in accordance with some embodiments.

FIG. 29 is a top view of a partial conductive lines layout of an exemplary integrated circuit device 500, in accordance with some embodiments. The conductive lines 129-1 and 129-2 having concave line-ends LE1 and LE2 are collocated with the conductive line 155 having convex line-ends LE3, and the conductive lines 157 and 158 having flat line-ends LE5 and LE6, as shown in FIG. 29 in accordance with some embodiments. The conductive lines 129-1 and 129-2 having the concave line-ends LE1 and LE2 may be formed by the exemplary method 1000, 2000 or 3000 for fabricating the integrated circuit device 100, 200 or 300, respectively. The conductive line 155 having the convex line-end LE3 may be formed by lithography and OPC technology. The conductive lines 157 and 158 having the flat line-ends LE5 and LE6 may be formed by a line cut process that uses a separation structure having the shape of a rectangle. The line cut process may be similar to the exemplary method 1000, 2000 or 3000 for fabricating the integrated circuit device 100, 200 or 300, respectively. The separation structure may be similar to the third hard mask portion 117' of FIGS. 8A and 8B or the second hard mask portion 151' of FIGS. 25A and 25B.

In some embodiments, the conductive lines 129-1 and 129-2, the conductive line 155, and the conductive lines 157 and 158 may be formed simultaneously in the same step of the fabrication process that uses the same photo mask. In some other embodiments, the conductive lines 129-1 and 129-2, the conductive line 155, and the conductive lines 157 and 158 may be formed independently in different steps of fabrication processes that use different photo masks. In some examples, the conductive line 155 and the conductive lines 157 and 158 may be arranged in parallel to the conductive lines 129-1 and 129-2. In some examples, the conductive line 155 and the conductive lines 157 and 158 may be arranged along the longitudinal axis of the conductive lines 129-1 and 129-2.

According to the embodiments of the disclosure, the conductive lines are formed by a line cut process that uses multiple depositing, lithography and etching processes to form the conductive lines 129-1 and 129-2 having the concave line-ends LE1 and LE2. In some instances, the line end space 130 between the conductive lines 129-1 and 129-2 may be reduced by about 50% of the line end space between the conductive lines having convex line-ends formed by lithography and OPC technology. The line end space 130 between the conductive lines 129-1 and 129-2 can be minimized by the line cut process of the embodiments of the disclosure. The conductive lines' routing efficiency is enhanced by the embodiments of the disclosure. Therefore, the embodiments of the disclosure can increase conductive lines' routing density for die size reduction and are suitable for IC technology nodes of N20, N16, N10, N7 and beyond.

In some embodiments, a method of fabricating an integrated circuit device is provided. The method includes depositing a dielectric layer over a substrate, and depositing a first hard mask layer on the dielectric layer. The method also includes forming a patterned second hard mask on the first hard mask layer, and forming a third hard mask portion in an opening of the patterned second hard mask. The method further includes removing the patterned second hard mask to leave the third hard mask portion on the first hard mask layer, and etching the first hard mask layer to form a patterned first hard mask. In addition, the method includes etching the dielectric layer by using the patterned first hard mask as an etching mask to form trenches in the dielectric layer, and filling the trenches with a conductive material to form conductive lines in the dielectric layer.

In some embodiments, a method of fabricating an integrated circuit device is provided. The method includes depositing a dielectric layer over a substrate, and forming a patterned first hard mask on the dielectric layer. The patterned first hard mask has a line-shaped opening. The method also includes forming a patterned photo-resist on the patterned first hard mask, in which the patterned photo-resist has an opening, and depositing a second hard mask material in the opening of the patterned photo-resist. The method further includes removing the patterned photo-resist to leave a second hard mask portion on the patterned first hard mask, and etching the dielectric layer by using the patterned first hard mask and the second hard mask portion as an etching mask to form trenches in the dielectric layer. In addition, the method includes filling the trenches with a conductive material to form conductive lines in the dielectric layer.

In some embodiments, an integrated circuit device is provided. The integrated circuit device includes a dielectric layer over a semiconductor substrate. The integrated circuit device also includes a first conductive line in the dielectric layer. The first conductive line has a first concave line-end. The integrated circuit device further includes a second conductive line in the dielectric layer. The second conductive line has a second concave line-end. In addition, the first concave line-end and the second concave line-end define a line end space between the first conductive line and the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, comprising:
    depositing a dielectric layer over a substrate;
    depositing a first hard mask layer on the dielectric layer;
    forming a patterned second hard mask on the first hard mask layer, wherein the patterned second hard mask has an opening;
    forming a third hard mask portion in the opening of the patterned second hard mask;
    removing the patterned second hard mask to leave the third hard mask portion on the first hard mask layer;
    etching the first hard mask layer to form a patterned first hard mask;
    etching the dielectric layer by using the patterned first hard mask as an etching mask to form trenches in the dielectric layer; and
    filling the trenches with a conductive material to form conductive lines.

2. The method as claimed in claim 1, wherein the third hard mask portion has a circular shape, the conductive lines are formed to have concave line-ends, and there is a line end space between the concave line-ends of the conductive lines.

3. The method as claimed in claim 1, wherein forming the patterned second hard mask comprises:
    depositing a second hard mask layer on the first hard mask layer;
    forming a patterned photo-resist on the second hard mask layer, wherein the patterned photo-resist has an opening with a circular shape; and
    etching the second hard mask layer by using the patterned photo-resist as an etching mask.

4. The method as claimed in claim 1, wherein forming the third hard mask portion comprises:
    depositing a third hard mask material on the patterned second hard mask and to fill the opening of the patterned second hard mask; and
    etching back the third hard mask material to form the third hard mask portion in the opening of the patterned second hard mask.

5. The method as claimed in claim 1, wherein the patterned second hard mask is removed by using an etching process, and the patterned second hard mask has an etch selectivity that is higher than etch selectivity of the first hard mask layer and etch selectivity of the third hard mask portion.

6. The method as claimed in claim 1, wherein forming the patterned first hard mask comprises:
    forming a patterned photo-resist on the first hard mask layer, wherein the patterned photo-resist has a line-shaped opening, and the third hard mask portion is located in the line-shaped opening; and
    etching the first hard mask layer by using the patterned photo-resist and the third hard mask portion as an etching mask.

7. The method as claimed in claim 1, further comprising:
    forming a patterned photo-resist on the patterned first hard mask;
    etching the dielectric layer by using the patterned photo-resist as an etching mask to form a via hole under the trench; and
    filling the via hole with the conductive material to form a via under the conductive line.

8. The method as claimed in claim 1, wherein the first hard mask layer and the third hard mask portion are made of the same material.

9. The method as claimed in claim 1, wherein the first hard mask layer, the patterned second hard mask and the third hard mask portion are made of different materials, respectively.

10. The method as claimed in claim 1, further comprising depositing an etch stop layer over the substrate, wherein the etch stop layer is between the dielectric layer and the substrate.

11. A method of fabricating an integrated circuit device, comprising:
- depositing a dielectric layer over a substrate;
- forming a patterned first hard mask on the dielectric layer, wherein the patterned first hard mask has a line-shaped opening;
- forming a patterned photo-resist on the patterned first hard mask, wherein the patterned photo-resist has an opening;
- depositing a second hard mask material in the opening of the patterned photo-resist;
- removing the patterned photo-resist to leave a second hard mask portion on the patterned first hard mask;
- etching the dielectric layer by using the patterned first hard mask and the second hard mask portion as an etching mask to form trenches in the dielectric layer; and
- filling the trenches with a conductive material to form conductive lines.

12. The method as claimed in claim 11, wherein the opening of the patterned photo-resist has a circular shape, and the second hard mask portion has the shape of a portion of the circle that overlaps the line-shaped opening of the patterned first hard mask.

13. The method as claimed in claim 12, wherein the conductive lines are formed to have concave line-ends, and a line end space is between the concave line-ends of the conductive lines.

14. The method as claimed in claim 11, wherein the second hard mask material is a flowable material while the second hard mask material is being deposited in the opening of the patterned photo-resist, and the second hard mask material is cured to form the second hard mask portion.

15. An integrated circuit device, comprising:
- a dielectric layer over a semiconductor substrate;
- a first conductive line in the dielectric layer, wherein the first conductive line has a first concave line-end; and
- a second conductive line in the dielectric layer, wherein the second conductive line has a second concave line-end, and the first concave line-end and the second concave line-end define a line end space between the first conductive line and the second conductive line.

16. The integrated circuit device as claimed in claim 15, further comprising an etch stop layer between the semiconductor substrate and the dielectric layer, and both the first conductive line and the second conductive line pass through the dielectric layer and the etch stop layer.

17. The integrated circuit device as claimed in claim 15, wherein the first conductive line and the second conductive line are embedded in the dielectric layer and do not pass through the dielectric layer.

18. The integrated circuit device as claimed in claim 15, further comprising a third conductive line in the dielectric layer, wherein the third conductive line is parallel to the first conductive line and the second conductive line in a top view, and the third conductive line has a convex line-end.

19. The integrated circuit device as claimed in claim 18, further comprising a fourth conductive line and a fifth conductive line in the dielectric layer, wherein longitudinal axes of the fourth conductive line and the fifth conductive line are aligned with each other and parallel to the first conductive line, the second conductive line and the third conductive line in a top view, and the fourth conductive line and the fifth conductive line have flat line-ends.

20. The integrated circuit device as claimed in claim 15, further comprising a via in the dielectric layer, wherein the via is disposed under, and is connected to, the first conductive line or the second conductive line.

* * * * *